(12) United States Patent
Koo et al.

(10) Patent No.: US 11,037,997 B2
(45) Date of Patent: Jun. 15, 2021

(54) DISPLAY APPARATUS

(71) Applicant: LG Display Co., Ltd., Seoul (KR)

(72) Inventors: Wonhoe Koo, Goyang-si (KR);
Dongmin Sim, Gimpo-si (KR);
Kyunghoon Han, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/849,497

(22) Filed: Apr. 15, 2020

(65) Prior Publication Data

US 2020/0357856 A1    Nov. 12, 2020

(30) Foreign Application Priority Data

May 8, 2019    (KR) .................. 10-2019-0053506

(51) Int. Cl.
*G06F 3/041* (2006.01)
*H01L 27/32* (2006.01)
*H01L 51/52* (2006.01)

(52) U.S. Cl.
CPC .......... *H01L 27/323* (2013.01); *G06F 3/0412* (2013.01); *H01L 51/5253* (2013.01)

(58) Field of Classification Search
CPC .. G06F 3/0412; H01L 27/323; H01L 51/5253
See application file for complete search history.

(56) References Cited

U.S. PATENT DOCUMENTS

| 2017/0012243 | A1* | 1/2017 | Suzuki | ................ H01L 51/5259 |
| 2018/0239455 | A1* | 8/2018 | Jia | ...................... G06K 9/00013 |
| 2018/0373372 | A1 | 12/2018 | Kim et al. | |

FOREIGN PATENT DOCUMENTS

KR    10-2019-0000553 A    1/2019

* cited by examiner

*Primary Examiner* — Insa Sadio
(74) *Attorney, Agent, or Firm* — Birch, Stewart, Kolasch & Birch LLP

(57) ABSTRACT

A display apparatus includes a substrate including a display area configured by a plurality of emission areas and a non-emission area between the plurality of emission areas; an encapsulation part which covers a display area; a touch part including a plurality of insulating layers disposed on the encapsulation part and a touch line in the non-emission area; and a plurality of light extraction patterns disposed between the touch line and the plurality of emission areas, in which the plurality of light extraction patterns includes grooves at at least a portion of the plurality of insulating layers.

20 Claims, 8 Drawing Sheets

DISPLAY APPARATUS

CROSS-REFERENCE TO RELATED APPLICATIONS

This application claims the benefit of and priority to Korean Patent Application No. 10-2019-0053506 filed on May 8, 2019 in the Republic of Korea, the entirety of which is hereby expressly incorporated by reference into the present application.

BACKGROUND

Technical Field

The present disclosure relates to a display apparatus, and more particularly, to a touch screen integrated display apparatus which improves a light extraction efficiency of light emitted from a light emitting element.

Description of the Related Art

An electroluminescent display apparatus is a self-emitting display apparatus where a separate light source is not necessary, which is different from a liquid crystal display apparatus having a separate light source. Therefore, the electroluminescent display apparatus can be manufactured to have a light weight and a small thickness. Further, since the electroluminescent display apparatus is driven at a low voltage, it is advantageous not only in terms of power consumption, but also in terms of the color implementation, the response speed, the viewing angle, and the contrast ratio (CR), so that the electroluminescent display apparatus is being studied as the next generation displays.

Among the electroluminescent display apparatuses, there is a touch screen integrated display apparatus including a touch part which recognizes a touch of a user. The touch screen integrated display apparatus directly can receive input information using a finger or a pen so that the touch screen integrated display apparatus can be widely applied to navigations, portable terminals, and home appliances.

SUMMARY

A general touch screen integrated display apparatus can include a plurality of light emitting elements disposed on a substrate, an encapsulation part disposed on the light emitting elements, and a touch part disposed on the encapsulation part. Light emitted from the light emitting elements passes through several components such as the encapsulation unit and the touch part to get out of the touch screen integrated display apparatus.

Generally, inorganic layers and organic layers used for the encapsulation part and the touch part have different refractive indexes. Therefore, some light emitted from the light emitting element cannot get out of the touch screen integrated display apparatus due to the total reflection or some light is refracted at an angle larger than an incident angle to be directed to the side surface rather than the front surface of the touch screen integrated display apparatus. Consequently, the light extraction efficiency of the touch screen integrated display apparatus can be lowered.

Therefore, the inventors of the present disclosure recognized problems in that some of light emitted from the light emitting element of a general touch screen integrated display apparatus is totally reflected or refracted at an angle larger than the incident angle to travel to a side direction rather than a front direction so that the light could not get out of the touch screen integrated display apparatus, but is trapped therein.

Therefore, the inventors of the present disclosure invented a new and improved touch screen integrated display apparatus with a new structure which enhances the light extraction efficiency.

Accordingly, the present disclosure is to provide a display apparatus which can improve a light extraction efficiency of light emitted from a light emitting element.

An aspect of the present disclosure is to provide a display apparatus which extracts light emitted from the light emitting element to the front direction to improve a viewing angle.

Another aspect of the present disclosure is to provide a display apparatus which refracts light having a large incident angle which is directed to a non-emission area enclosing an emission area to have a small incident angle to minimize light which is totally reflected or travels in a side direction of the display apparatus.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

According to an aspect of the present disclosure, a display apparatus includes a substrate including a display area configured by a plurality of emission areas and a non-emission area between the plurality of emission areas; an encapsulation part which covers a display area; a touch part including a plurality of insulating layers disposed on the encapsulation part and a touch line in the non-emission area; and a plurality of light extraction patterns disposed between the touch line and the plurality of emission areas, in which the plurality of light extraction patterns includes grooves at at least a portion of the plurality of insulating layers. Accordingly, the plurality of light extraction patterns lowers an incident angle of at least some of light directed to the non-emission area to be refracted toward a front direction of the substrate or minimize light which is totally reflected. Further, a light extraction efficiency of the display apparatus can be improved.

According to another aspect of the present disclosure, a display apparatus includes a substrate having a plurality of emission areas and a non-emission area between the plurality of emission areas; an encapsulation part which covers the substrate; a touch part disposed on the encapsulation part; and a plurality of light extraction patterns disposed to surround the plurality of emission areas in the non-emission area, in which a width of the plurality of light extraction patterns becomes narrower as it is adjacent to the substrate, and the plurality of light extraction patterns extracts at least a portion of light which is directed from the plurality of emission areas to the non-emission area to a front direction of the substrate. Accordingly, the light extraction patterns are disposed to refract light which travels toward a side direction of the substrate to the emission area and the front direction of the display apparatus. Therefore, the viewing angle and the luminance of the display apparatus can be improved.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

According to an embodiment of the present disclosure, a usage rate of light emitted from the light emitting element is increased to improve an efficiency and power consumption of the display apparatus.

According to an embodiment of the present disclosure, light emitted from the light emitting element is extracted in a front direction as much as possible to improve a viewing angle of the display apparatus.

According to an embodiment of the present disclosure, an incident angle of light which is directed to a non-emission area is lowered as much as possible to reduce the light trapped in the display apparatus, thereby improving the luminance of the display apparatus.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

Figure 1:
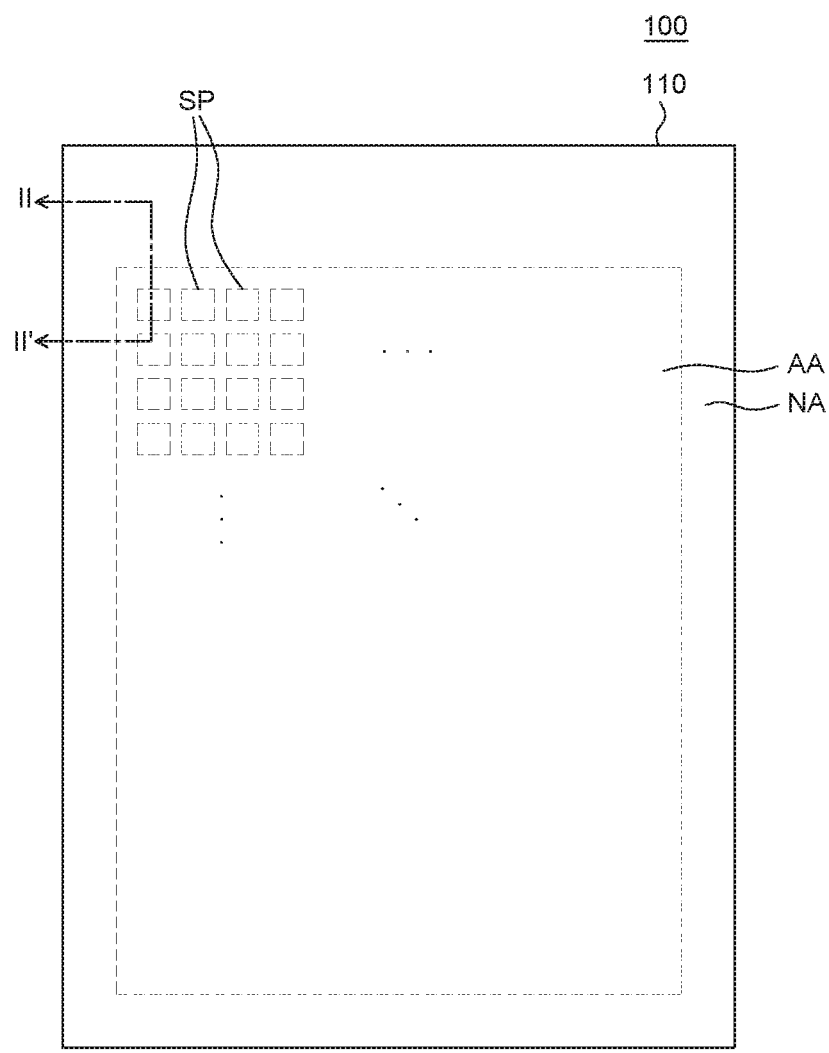
FIG. 1 illustrates a display apparatus according to an exemplary embodiment of the present disclosure.

Throughout the drawings and the detailed description, unless otherwise described, the same drawing reference numerals should be understood to refer to the same elements, features, and structures. The relative size and depiction of these elements can be exaggerated for clarity, illustration, and convenience

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, the element or layer can be directly on the another element or layer or one or more additional elements or layers can be interposed therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display apparatus according to exemplary embodiments of the present disclosure will be described in detail with reference to accompanying drawings.

FIG. 1 is a plan view of a display apparatus 100 according to an exemplary embodiment of the present disclosure. All the components of the display apparatus according to all embodiments of the present disclosure are operatively coupled and configured. In FIG. 1, for the convenience of description, among various components of the display apparatus 100, only a substrate 110 and a plurality of sub pixels SP are illustrated.

Referring to FIG. 1, the substrate 110 is a support member for supporting other components of the display apparatus 100 and can be configured by an insulating material. For example, the substrate 110 can be formed of glass or resin. Further, the substrate 110 can be configured to include plastics such as polymer or polyimide (PI) or can be formed of a material having flexibility.

The substrate 110 includes a display area AA and a non-display area NA.

The display area AA is an area where images are displayed. In the display area AA, a plurality of sub pixels SP which displays images and a circuit part for driving the plurality of sub pixels SP can be disposed. The circuit part can include various thin film transistors, capacitors, and wiring lines configured to drive the sub pixels SP. For example, the circuit part can include various components such as a driving thin film transistor, a switching thin film transistor, a storage capacitor, a gate line, and a data line, but is not limited thereto.

The non-display area NA is an area where no image is displayed and various wiring lines and driver ICs (integrated circuits) configured to drive the sub pixels SP disposed in the display area AA are disposed. For example, in the non-display area NA, various driver ICs such as a gate driver IC and a data driver IC can be disposed.

Even though in FIG. 1, it is illustrated that the non-display area NA encloses or surrounds the display area AA, the non-display area NA can be an area extending from one side of the display area AA, but is not limited thereto.

The plurality of sub pixels SP is disposed in the display area AA of the substrate 110. Each of the plurality of sub pixels SP is an individual part that emits light. In each of the plurality of sub pixels SP, a light emitting element and a driving circuit are formed. For example, the plurality of sub pixels SP can include a red sub pixel, a green sub pixel, and a blue sub pixel, but is not limited thereto and the plurality of sub pixels SP can further include a white sub pixel.

Hereinafter, the plurality of sub pixels SP will be described in more detail with reference to FIG. 2.

Figure 2:
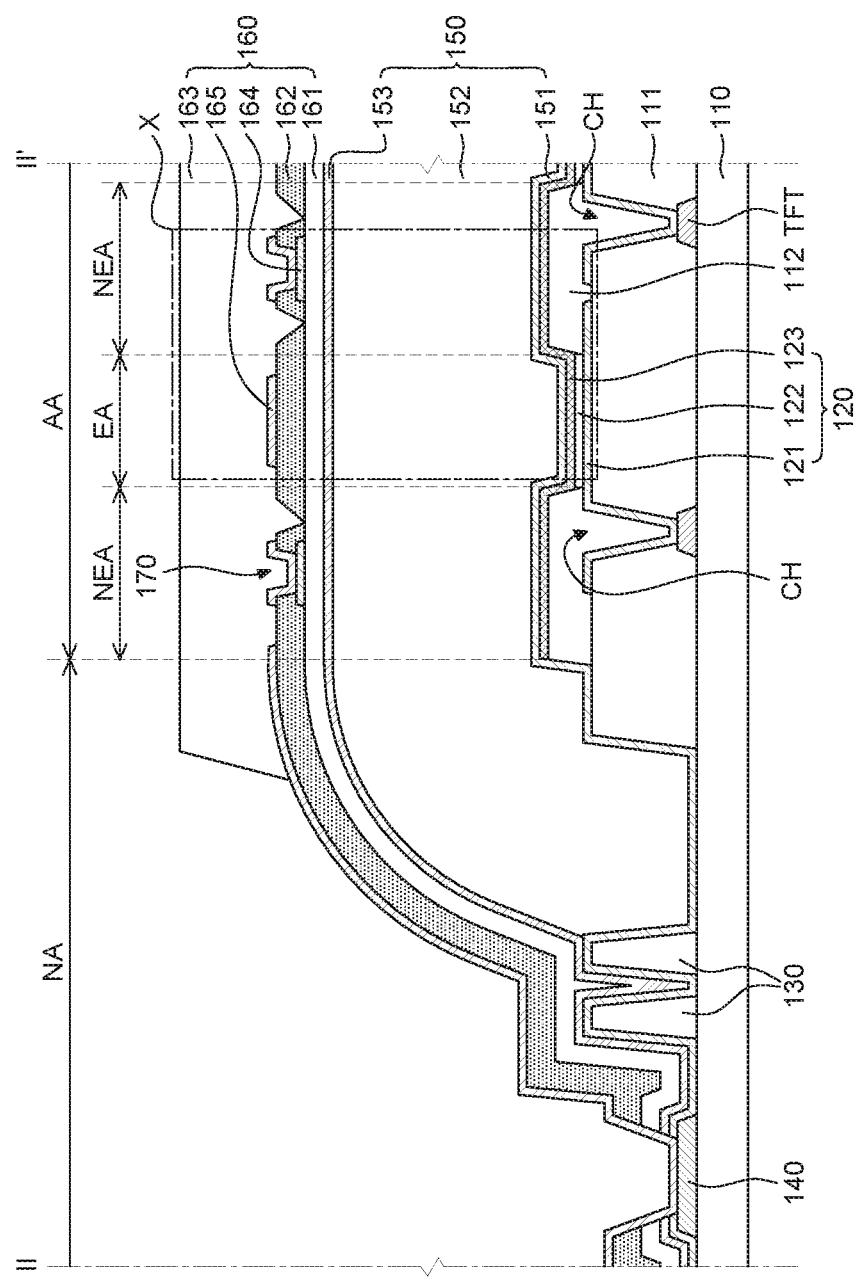
FIG. 2 is a cross-sectional view taken along line II-II' of FIG. 1.

FIG. 2 is a cross-sectional view taken along line II-II' of FIG. 1. With reference to FIG. 2, the display apparatus 100 according to an exemplary embodiment of the present disclosure includes the substrate 110, a transistor TFT, a planarizing layer or passivation layer 111, a light emitting element 120, a bank 112, a pad part 140, a dam 130, an encapsulation part 150, a touch part 160, and a light extraction pattern 170.

The transistor TFT is disposed on the substrate 110. The transistor TFT transmits or transfers a data voltage to the plurality of sub pixels SP.

The transistor TFT includes a gate electrode, an active layer, a source electrode, and a drain electrode.

The active layer can be disposed on the substrate 110. The active layer can include an oxide semiconductor, an amorphous silicon, or a poly silicon, etc.

Depending on a structure of the transistor TFT, a gate electrode can be disposed above or below the active layer. The gate electrode can be formed of a conductive material such as copper (Cu), aluminum (Al), molybdenum (Mo), titanium (Ti), or an alloy thereof, but it not limited thereto.

A gate insulating layer can be disposed between the active layer and the gate electrode. The gate insulating layer is a layer that insulates the gate electrode from the active layer and can be formed of an insulating material. For example, the gate insulating layer can be configured by a single layer or a double (or dual) layer of silicon oxide (SiOx) and silicon nitride (SiNx), but is not limited thereto.

A source electrode and a drain electrode which are electrically connected to the active layer and are spaced apart from each other can be disposed. The source electrode and the drain electrode can be formed of a conductive material, such as copper (Cu), aluminum (Al), molybdenum (Mo), titanium (Ti), or an alloy thereof, but it not limited thereto.

Depending on the structure of the transistor TFT, in order to insulate the gate electrode from the source electrode and the drain electrode, an interlayer insulating layer can be further disposed between the gate electrode and the source electrode and the drain electrode, but is not limited thereto.

The planarizing layer or passivation layer 111 is disposed on the transistor TFT. The planarizing layer 111 planarizes an upper portion of a partial area of the substrate 110. For example, the planarizing layer 111 can be disposed in the display area AA, and may not be disposed in an entire area or partial area of the non-display area NA.

The planarizing layer 111 can include a single layer or a double layer, and can be formed of an organic material. For example, the planarizing layer 111 can be formed of an acrylic organic material, but is not limited thereto. The planarizing layer 111 includes a contact hole CH that electrically connects the transistor TFT to the light emitting element 120.

The light emitting element 120 is disposed on the planarizing layer 111. The light emitting element 120 is a self-emitting element that emits light and is driven with a voltage supplied from the transistor TFT. The light emitting element 120 includes an anode 121, a light emitting layer 122, and a cathode 123.

The anode 121 is disposed on the planarizing layer 111 to be separated for every sub pixel SP. The anode 121 is electrically connected to the transistor TFT through the contact hole CH in the planarizing layer 111. The anode 121 is formed of a conductive material that is capable of supplying holes to the light emitting layer 122. For example, the anode 121 can be formed of a transparent conductive material, such as tin oxide (TO), indium tin oxide (ITO), indium zinc oxide (IZO), or indium zinc tin oxide (ITZO), and a reflective layer formed of a material having an excellent reflectivity, such as silver (Ag) or a silver alloy (Ag alloy), but is not limited thereto.

The bank 112 is disposed on the anode 121 and the planarizing layer 111. The bank 112 is an insulating layer that separates adjacent sub pixels SP. The bank 112 can be disposed to open a part of the anode 121. The bank 112 can be an organic insulating material that is disposed to cover an edge of the anode 121.

The light emitting layer 122 is disposed on the anode 121. The light emitting layer 122 can be configured as one light emitting layer 122 or can have a structure in that a plurality of light emitting layers 122 emitting different color light is laminated or stacked. The light emitting layer 122 can further include a hole injection layer, a hole transport layer, a hole blocking layer, an electron transport layer, an electron injection layer, and an electron blocking layer. With reference to FIG. 2, the light emitting layer 122 disposed in each sub pixel SP is separately disposed for every sub pixel SP, but is not limited thereto. For example, all or a part of the light emitting layer 122 can be formed as one layer over the plurality of sub pixels SP. Further, the light emitting layer 122 can be an organic light emitting layer formed of an organic material, but is not limited thereto. For example, the light emitting layer 122 can be a quantum dot light emitting layer or a micro LED.

The cathode 123 is disposed on the light emitting layer 122. The cathode 123 is formed of a conductive material that supplies electrons to the light emitting layer 122. For example, the cathode 123 can be formed of transparent conductive oxide such as indium tin oxide (ITO), indium zinc oxide (IZO), indium tin zinc oxide (ITZO), zinc oxide (ZnO), and tin oxide (TO) or an ytterbium (Yb) alloy, but is not limited thereto. With reference to FIG. 2, even though it is illustrated that the cathodes 123 disposed in the sub pixels SP are connected to each other, the cathodes are separately disposed for every sub pixel SP, like the anode 121, but it is not limited thereto.

The display area AA can include a plurality of emission areas EA and a non-emission area NEA between the plurality of emission areas EA.

Areas where the plurality of light emitting elements 120 is disposed can be a plurality of emission areas EA. The plurality of emission areas EA that independently emits one color light can correspond to the plurality of sub pixels SP. The plurality of emission areas EA can be an area where no bank 112 is disposed. For example, the plurality of emission areas EA can include a red emission area, a green emission area, and a blue emission area, but is not limited thereto. The plurality of emission areas EA can be disposed to be spaced apart from each other, and for example, can be disposed in a matrix shape to be disposed in a row direction and a column direction, but is not limited thereto.

An area where the plurality of light emitting elements 120 is not disposed can be a non-emission area NEA. The non-emission area NEA is disposed between the plurality of emission areas EA and the bank 112 can be disposed therein. The non-emission area NEA is disposed to enclose or surround the plurality of emission areas EA so that the non-emission areas NEA can be formed as a mesh shape.

The dam 130 is disposed in the non-display area NA. For example, in the non-display area NA, the dam 130 is disposed on the substrate 110. The dam 130 is disposed to control the spreading of an organic encapsulation layer 152 of the encapsulation part 150 that is disposed to cover the display area AA. For example, the dam 130 can suppress or reduce the overflow of the organic encapsulation layer 152 of the encapsulation part 150. One or more dams 130 can be configured and the number of dams to be disposed is not limited.

The pad part 140 is disposed in the non-display area NA. The pad part 140 can be disposed at an outside of the dam 130. A signal can be input to the circuit part and the driver IC formed on the substrate 110 through the pad part 140. For example, the pad part 140 can supply a signal supplied from the outside to the circuit part and the driver IC of the substrate 110. For example, the pad part 140 can supply a signal to a touch line 164 and a touch electrode 165 of the touch part 160 to drive the touch part 160.

The encapsulation part 150 is disposed on the light emitting element 120. The encapsulation part 150 is a sealing member that protects the light emitting element 120 from moisture, oxygen, and impact of the outside. The encapsulation part 150 can be disposed to cover the entire display area AA in which the light emitting element 120 is disposed, and also disposed to cover a part of the non-display area NA extending from the display area AA. The encapsulation part 150 can include a first inorganic encapsulation layer 151 that is formed of an inorganic material, an organic encapsulation layer 152 on the first inorganic encapsulation layer 151 and formed of an organic material, and a second inorganic encapsulation layer 153 on the organic encapsulation layer 152.

The first inorganic encapsulation layer 151 seals the display area AA to protect the light emitting element 120 from oxygen and moisture that penetrate into the display area AA. The first inorganic encapsulation layer 151 can be disposed not only in the display area AA, but also in the non-display area NA extending from the display area AA. The first inorganic encapsulation layer 151 can be disposed to cover the dam 130 of the non-display area NA. The first inorganic encapsulation layer 151 is formed of an inorganic material, such as silicon nitride (SiNx) or silicon oxynitride (SiON), but is not limited thereto.

The organic encapsulation layer 152 is disposed on the first inorganic encapsulation layer 151. The organic encapsulation layer 152 planarizes an upper portion of the first inorganic encapsulation layer 151 and fills cracks that can be generated in the first inorganic encapsulation layer 151. When foreign substances are disposed on the first inorganic encapsulation layer 151, the organic encapsulation layer 152 can planarize an upper portion of the foreign substances. The organic encapsulation layer 152 can be disposed in the display area AA and a part of the non-display area NA extending from the display area AA. The organic encapsulation layer 152 can be disposed in the inside of the dam 130. The organic encapsulation layer 152 can be formed of epoxy based polymer or acrylic based polymer, but is not limited thereto.

The second inorganic encapsulation layer 153 is disposed on the organic encapsulation layer 152. The second inorganic encapsulation layer 153 can seal the organic encapsulation layer 152 together with the first inorganic encapsulation layer 151 by being in contact with the first inorganic encapsulation layer 151 at an outer part of the display apparatus 100. The second inorganic encapsulation layer 153 can be disposed in the display area AA and a part or some portion of the non-display area NA extending from the display area AA. The second inorganic encapsulation layer 153 can be disposed to be in contact with the first inorganic encapsulation layer 151 in the non-display area NA. The second inorganic encapsulation layer 153 is formed of an inorganic material, such as silicon nitride (SiNx) or silicon oxy nitride (SiON), but is not limited thereto.

Refractive indexes of the first inorganic encapsulation layer 151 and the second inorganic encapsulation layer 153 can be higher than a refractive index of the organic encapsulation layer 152. For example, when acrylic polymer is used for the organic encapsulation layer 152, the refractive index of the organic encapsulation layer 152 can be approximately 1.58. Other materials that can be used for the organic encapsulation layer 152 can also have a similar or same refractive index. Further, when silicon nitride (SiNx) is used for the first inorganic encapsulation layer 151 and the second inorganic encapsulation layer 153, the refractive indexes of the first inorganic encapsulation layer 151 and the second inorganic encapsulation layer 153 can be approximately 1.85. Other materials that can be used for the first inorganic encapsulation layer 151 and the second inorganic encapsulation layer 153 can also have a similar or same refractive index. Therefore, the light emitted from the light emitting element 120 can be refracted or totally reflected from an interface of the first inorganic encapsulation layer 151 and the organic encapsulation layer 152, and an interface of the organic encapsulation layer 152 and the second inorganic encapsulation layer 153.

Even though in FIG. 2, it is illustrated that the encapsulation part 150 includes the first inorganic encapsulation layer 151, the organic encapsulation layer 152, and the second inorganic encapsulation layer 153, the number of inorganic encapsulation layers and the number of organic encapsulation layers in the encapsulation part 150 are not limited thereto.

The touch part 160 is disposed on the encapsulation part 150. The touch part 160 is disposed in the display area AA including the light emitting element 120 to sense a touch input. The touch part 160 can sense external touch information using a finger of the user or a touch pen. The touch part 160 includes a first inorganic insulating layer 161, a second inorganic insulating layer 162, an organic insulating layer 163, the touch line 164, and the touch electrode 165.

The first inorganic insulating layer 161 of the touch part 160 is disposed on the encapsulation part 150. The first inorganic insulating layer 161 is in contact on the second inorganic encapsulating layer 153 of the encapsulation part 150. The first inorganic insulating layer 161 can be formed of an inorganic material. For example, the first inorganic insulating layer can be formed of an inorganic material such as silicon nitride (SiNx) and silicon oxy nitride (SiON), but is not limited thereto. The first inorganic insulating layer 161 can be a buffer layer, but is not limited to the term.

The touch line 164 is disposed on the first inorganic insulating layer 161. The touch line 164 is disposed in the non-emission area NEA on the first inorganic insulating layer 161. The touch line 164 can be disposed in a row direction or a column direction. The touch line 164 supplies a touch driving signal to drive the touch part 160. Further, the touch line 164 can transmit or transfer the touch information sensed by the touch part 160 to the driver IC.

The second inorganic insulating layer 162 is disposed on the touch line 164 and the first inorganic insulating layer 161. The second inorganic insulating layer 162 can suppress or reduce the short-circuit of the touch line 164 that is disposed to be adjacent thereto. The second inorganic insulating layer 162 can be formed of an inorganic material. For example, the second inorganic insulating layer 162 can be formed of an inorganic material such as silicon nitride (SiNx) and silicon oxy nitride (SiON), but is not limited thereto. The second inorganic insulating layer 162 can be an interlayer insulating layer or an insulating layer, but is not limited to the term.

The touch electrode 165 is disposed on the touch line 164 and the second inorganic insulating layer 162. The touch electrode 165 can be disposed in a row direction or a column direction. For example, the touch electrode 165 disposed in one of the row direction and the column direction can be disposed above the touch line 164. The touch electrode 165 that is disposed in the other of the row direction or the column direction can be disposed on the second inorganic insulating layer 162. The touch electrode 165 disposed in the column direction and the touch electrode 165 disposed in the row direction are connected to each other through a bridge electrode to have a mesh structure. Even though in FIG. 2, it is illustrated that the touch electrode 165 is disposed in the emission area EA, the touch electrode 165 may not be disposed in the emission area EA, but is not limited thereto.

The touch electrode 165 disposed at an outermost portion of the display area AA extends to the pad part 140 of the non-display area NA to be electrically connected to the pad part 140. The touch electrode 165 can sense a touch position on the display area AA, and transmit or transfer touch information including the touch position to the pad part 140.

The organic insulating layer 163 is disposed on the touch electrode 165 and the second inorganic insulating layer 162. The organic insulating layer 163 can planarize an upper portion of the touch electrode 165, and protect components below the organic insulating layer 163. Epoxy based polymer or acrylic based polymer can be used for the organic insulating layer 163, but is not limited thereto. The organic insulating layer 163 can be an over coating layer, but is not limited to the term.

A refractive index of at least one of the second inorganic encapsulation layer 153, the first inorganic insulating layer 161, and the second inorganic insulating layer 162 can be higher than a refractive index of the organic insulating layer 163. For example, the refractive index of the second inorganic encapsulation layer 153, the first inorganic insulating layer 161, and the second inorganic insulating layer 162 can be higher than a refractive index of the organic insulating layer 163. For example, when silicon nitride (SiNx) is used for the first inorganic insulating layer 161 and the second inorganic insulating layer 162, the refractive index of the first inorganic insulating layer 161 and the second inorganic insulating layer 162 can be approximately 1.85. Other materials which can be used for the first inorganic insulating layer 161 and the second inorganic insulating layer 162 can also have a similar refractive index. When an acrylic polymer is used for the organic insulating layer 163, the refractive index of the organic insulating layer 163 can be approximately 1.58 Other materials which can be used for the organic insulating layer 163 can also have a similar refractive index.

The first inorganic insulating layer 161, the second inorganic insulating layer 162, and the second inorganic encapsulation layer 153 below the organic insulating layer 163 can be formed of the same material so that the refractive indexes can be the same or substantially the same. Therefore, when light emitted from the light emitting element 120 is directed to the first inorganic insulating layer 161 and the second inorganic insulating layer 162 of the touch part 160 from the encapsulation part 150, there is substantially no difference in the refractive indexes of the second inorganic encapsulation layer 153 at the outermost portion of the encapsulation part 150, the first inorganic insulating layer 161 and the second inorganic insulating layer 162 of the touch part 160, so that the light can continuously travel straight.

Next, when the light emitted from the light emitting element 120 travels to the organic insulating layer 163 having a low refractive index from the second inorganic insulating layer 162 having a high refractive index, if the light has an incident angle that is smaller than a critical angle, the light is refracted to have a refraction angle larger than the incident angle and is directed to the organic insulating layer 163. The light that passes through the encapsulation part 150 and the first inorganic insulating layer 161 of the touch part 160 can be refracted to have a refraction angle larger than an incident angle at an interface between the second inorganic insulating layer 162 and the organic insulating layer 163.

Further, the light refracted to have a larger refraction angle is incident onto the interface between the organic insulating layer 163 and a plurality of components disposed above the organic insulating layer 163 at an incident angle larger than an initial incident angle to travel toward a side direction of the substrate 110 or be totally reflected. For example, various optical films such as a polarizing plate or protective films and an adhesive layer that attaches the films can be disposed above the organic insulating layer 163.

Further, the light that is refracted at the interface of the second inorganic insulating layer 162 and the organic insulating layer 163 to have a larger refraction angle can travel toward the side direction of the substrate 110 or be totally reflected at the interface between the organic insulating layer 163 and the adhesive layer, and the interface between the adhesive layer and various optical films or protective films.

When the light emitted from the light emitting element 120 travels to the organic insulating layer 163 having a low refractive index from the second inorganic insulating layer 162 having a high refractive index, light having an incident angle larger than the critical angle can be totally reflected to be reflected to an inner side or inner portion of the display apparatus 100 from the interface between the second inorganic insulating layer 162 and the organic insulating layer 163.

Therefore, the light emitted from the light emitting element 120 is refracted to have a refraction angle larger than an initial incident angle at the interface of the second inorganic insulating layer 162 and the organic insulating layer 163 to travel toward the side direction of the substrate 110 or be totally reflected. Therefore, light that is extracted to the front direction of the substrate 110 can be reduced, and light is trapped in the organic encapsulation layer 152 so that the light extraction efficiency can be degraded.

Therefore, in the display apparatus 100 according to an embodiment of the present disclosure, a plurality of light extraction patterns 170 can be disposed on the second inorganic insulating layer 162. For example, the plurality of light extraction patterns 170 can be implemented by patterning the second inorganic insulating layer 162 in the non-emission area NEA. Therefore, the light that is totally reflected or is directed to the non-emission area NEA can be extracted to the front direction of the substrate 110. Further, the light trapped in the display apparatus 100 is extracted to the outside so that the light extraction efficiency can be improved.

The plurality of light extraction patterns 170 is disposed between the touch line 164 and the emission area EA. The plurality of light extraction patterns 170 can extract at least some of light that is totally reflected or refracted with a refraction angle larger than the incident angle between components having different refractive indexes, for example, the second inorganic insulating layer 162 and the organic insulating layer 163 to travel to the non-emission area NEA rather than the front direction of the substrate 110, to the front direction of the substrate 110. Therefore, the light trapped in the display apparatus 100 is extracted to the outside so that the light extraction efficiency can be improved.

The plurality of light extraction patterns 170 can be grooves in the touch part 160. For example, the plurality of light extraction patterns 170 is grooves formed in the second inorganic insulating layer 162 in the non-emission area NEA, and is disposed between the touch line 164 and the emission area EA. For example, the light extraction patterns 170 can be disposed along the periphery of the emission area EA. Therefore, the light that is refracted to have a refraction angle larger than the initial incident angle at the interface of the second inorganic insulating layer 162 and the organic insulating layer 163, or the light trapped in the organic encapsulation layer 152 can be extracted to the front direction.

A polarizing plate can be further disposed on the touch part 160. The polarizing plate is disposed on the touch part 160 to reduce the reflection of external light that is incident onto the display apparatus 100. Further, various optical films or protective films can be disposed on the touch part 160.

Hereinafter, the plurality of light extraction patterns 170 will be described in more detail with reference to FIGS. 3 and 4.

Figure 3:
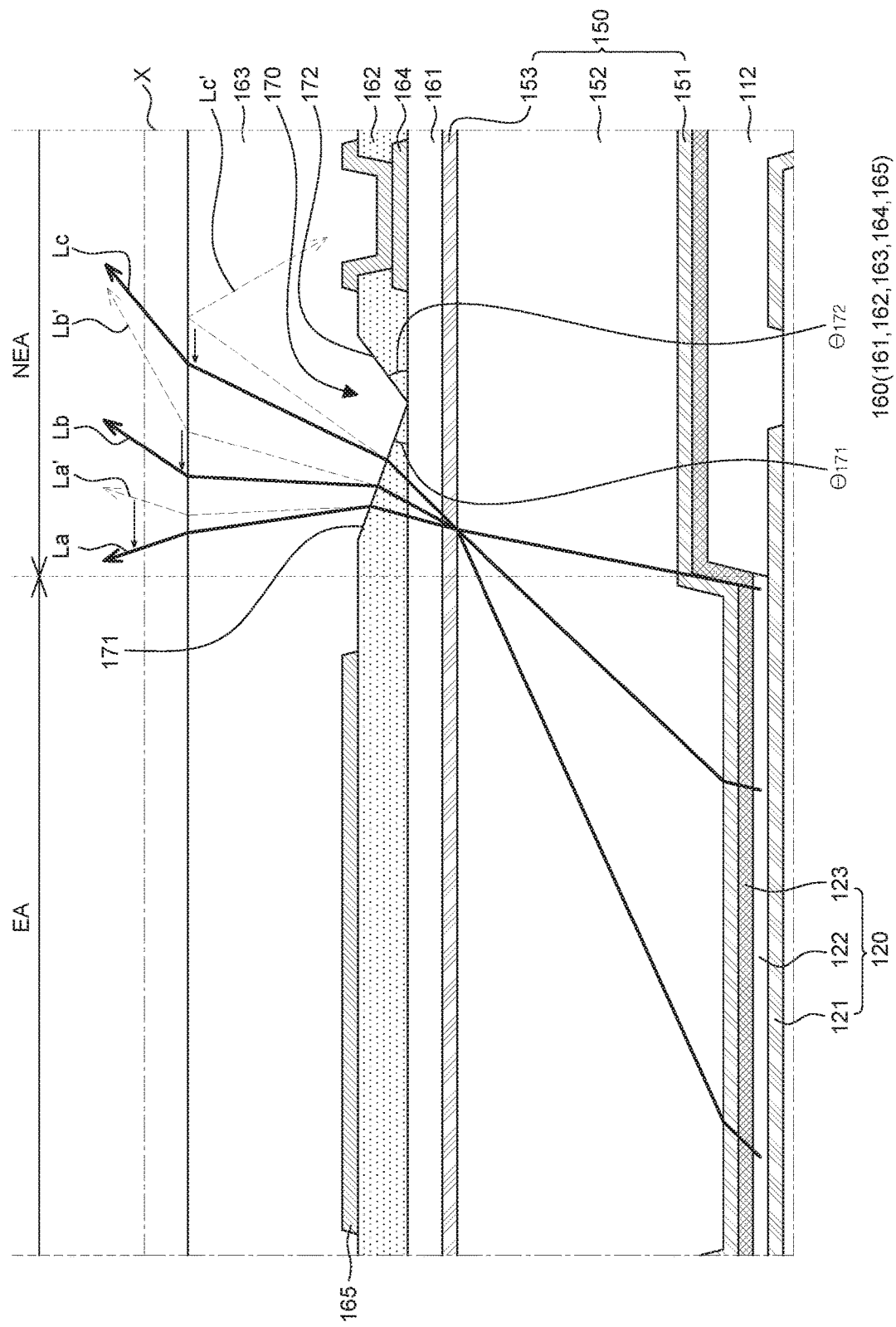
FIG. 3 is an enlarged cross-sectional view of an area X of FIG. 2.

FIG. 3 is an enlarged cross-sectional view of an area X of FIG. 2. FIG. 4 is an enlarged plan view of a display apparatus according to an exemplary embodiment of the present disclosure. In FIG. 4, for the convenience of description, among various components of the display apparatus 100, only the touch line 164, the light emitting element 120, and the light extraction pattern 170 are illustrated.

With reference to FIG. 3, the plurality of light extraction patterns 170 on the second inorganic insulating layer 162 includes a first surface 171 and a second surface 172. The first surface 171 is disposed to be adjacent to the emission area EA in the non-emission area NEA and the second surface 172 is disposed between the first surface 171 and the touch line 164 in the non-emission area NEA. A width between the first surface 171 and the second surface 172 can be narrower as it is closer to the encapsulation part 150. For example, the plurality of light extraction patterns 170 can be V-shaped grooves. As another example, the light extraction pattern 170 can be a triangular, convex, concave, convex lens, or concave lens.

The first surface 171 and the second surface 172 are configured as side surfaces of the second inorganic insulating layer 162. Further, the organic insulating layer 163 can be disposed in the plurality of light extraction patterns 170 that are grooves formed in the second inorganic insulating layer 162, for example, between the first surface 171 and the second surface 172. The organic insulating layer 163 disposed on the second inorganic insulating layer 162 can be disposed to fill the inside or inner portion of the plurality of light extraction patterns 170.

The first surface 171 and the second surface 172 can be disposed to be inclined. An upper side of the first surface 171 is disposed to be adjacent to the plurality of emission areas EA. A lower side of the first surface 171 can be disposed to be further adjacent (e.g., to be closer) to the touch line 164 than the upper side of the first surface 171. For example, the first surface 171 can be disposed to be inclined toward the emission area EA with respect to an upper surface of the first inorganic insulating layer 161 and disposed to form a first inclination angle $\theta_{171}$ with the upper surface of the first inorganic insulating layer 161.

An upper side of the second surface 172 is disposed to be adjacent to the touch line 164. A lower side of the second surface 172 can be disposed to be further adjacent (e.g., to be closer) to the emission area EA than the upper side of the second surface 172. For example, the second surface 172 can be disposed to be inclined toward the touch line 164 with respect to the upper surface of the first inorganic insulating layer 161, and the second surface 172 can be disposed to form a second inclination angle $\theta_{172}$ with the upper surface of the first inorganic insulating layer 161.

The interface of the second inorganic insulating layer 162 and the organic insulating layer 163 at the first surface 171 having the first inclination angle $\theta_{171}$ is not parallel to the upper surface of the first inorganic insulating layer 161 but can have a slope or inclination. The interface of the second inorganic insulating layer 162 and the organic insulating layer 163 at the second surface 172 having the second inclination angle $\theta_{172}$ is not parallel to the upper surface of the first inorganic insulating layer 161 but can have a slope or inclination.

The first surface 171 and the second surface 172 have the first inclination angle $\theta_{171}$ and the second inclination angle $\theta_{172}$, respectively, so that incident angles of at least some of light incident onto the plurality of light extraction patterns 170 can be lowered. For example, the slope of the interface of the second inorganic insulating layer 162 and the organic insulating layer 163 on the first surface 171 can be determined by the first inclination angle $\theta_{171}$ of the first surface 171. When it is assumed that light directed to the non-emission area NEA from the emission area EA is directed to the interface of the second inorganic insulating layer 162 and the organic insulating layer 163, an incident angle of light with respect to a parallel interface between the second inorganic insulating layer 162 without the plurality of light extraction patterns 170 and the organic insulating layer 163 can be different from an incident angle of light with respect to the first surface 171 and the second surface 172 of the light extraction pattern 170.

The light traveling to the non-emission area NEA can have a large incident angle with respect to the upper surface of the first inorganic insulating layer 161 that is disposed to be parallel to the upper surface of the substrate 110. Therefore, light traveling to the non-emission area NEA can be incident onto a parallel interface between the first inorganic insulating layer 161 without the light extraction patterns 170 and the second inorganic insulating layer 162 with a large incident angle. In contrast, when the same light is incident onto the first surface 171 of the light extraction pattern 170, since the first surface 171 of the light extraction pattern 170 has a slope, the incident angle of light with respect to the interface between the second inorganic insulating layer 162 and the organic insulating layer 163 on the first surface 171 can be reduced.

Therefore, when among light traveling to the organic insulating layer 163 having a low refractive index from the second inorganic insulating layer 162 having a high refractive index, light that is directed to the non-emission area NEA and has a large incident angle is incident onto the light extraction pattern 170, the incident angle is reduced. Thus, the refraction angle is reduced so that the light can travel so as to be close to the front direction of the substrate 110. Therefore, light that is directed to the non-emission area NEA and has a large incident angle is incident from the light extraction pattern 170 at a small incident angle so that the light is refracted with a relatively small refraction angle. Accordingly, light extracted to the front direction of the substrate 110 is increased and totally reflected light can also be minimized.

Therefore, the plurality of light extraction patterns 170 including the first surface 171 and the second surface 172 that are disposed to be inclined is disposed on the second inorganic insulating layer 162 of the non-emission area NEA. As such, the incident angle of light can be lowered to reduce the total reflection of the light, and the light can be extracted to the front direction of the substrate 110 as much as possible.

At least some of light that travels to the non-emission area NEA and has a large incident angle can travel straight in the light extraction pattern 170. For example, when among light directed to the non-emission area NEA, specific light has a specific incident angle with respect to a parallel interface and the specific incident angle is the same as the first inclination angle $\theta_{171}$ of the first surface 171, even though the light is incident onto the first surface 171 of the light extraction pattern 170, the incident angle is 0 degree. Therefore, the light may not be refracted, but travel straight. Therefore, among light directed to the non-emission area NEA by the light extraction pattern 170, at least some light is not refracted so that the light that is totally reflected or travels to the side direction of the display apparatus 100 can be reduced.

Hereinafter, as illustrated in FIG. 3, when the light extraction pattern 170 is disposed, among light emitted from the light emitting element 120, light traveling to the non-emission area NEA is assumed as light A (La), light B (Lb), and light C (Lc). Further, when the light extraction pattern 170 is not disposed so that the upper surface of the second inorganic insulating layer 162 is parallel to the upper surface of the substrate 110, like the upper surface of the first inorganic insulating layer 161, light traveling to the non-emission area NEA is assumed as light A' (La'), light B' (Lb'), and light C' (Lc').

First, unlike what is illustrated in FIG. 3, when the light extraction pattern 170 is not disposed on the second inorganic insulating layer 162, the upper surface of the second inorganic insulating layer 162 can also be disposed to be parallel to the upper surface of the substrate 110, like the upper surface of the first inorganic insulating layer 161. The light A' (La') and light B' (Lb') are incident onto the parallel interface between the second inorganic insulating layer 162 and the organic insulating layer 163 with a large incident angle so as to be refracted to have a refraction angle larger than the incident angle. In this case, the light A' (La') and light B' (Lb') are refracted at an angle larger than the existing incident angle so that the light A' (La') and light B' (Lb') can travel to the interface between the organic insulating layer 163 and an air layer above the organic insulating layer 163 with a larger incident angle. Further, the light A' (La') and light B' (Lb') can travel to be closer to the side direction of the substrate 110, rather than the front direction.

The light C' (Lc') is incident onto the parallel interface between the second inorganic insulating layer 162 and the organic insulating layer 163 with a large incident angle so as to be refracted to have a refraction angle larger than the incident angle. Further, the light C' that is refracted at a larger refraction angle to travel in the organic insulating layer 163 is incident at the interface between the organic insulating layer 163 and the air layer above the organic insulating layer 163 with an incident angle larger than the critical angle to be totally reflected.

Therefore, some of light directed to the non-emission area NEA, for example, the light A' (La') and the light B' (Lb') are incident with a large incident angle onto the parallel interface between the second inorganic insulating layer 162 and the organic insulating layer 163 because the light extraction pattern 170 is not disposed. As a result, the light is refracted to be directed to the side direction rather than the front direction of the substrate 110. The other light, for example, the light C' (Lc') can be refracted at an angle larger than the critical angle to be totally reflected.

In contrast, as illustrated in FIG. 3, the light extraction pattern 170 is disposed on the second inorganic insulating layer 162 and the interface between the second inorganic insulating layer 162 and the organic insulating layer 163 can be disposed in the light extraction pattern 170 to be inclined. Further, among the light directed to the non-emission area NEA, the light A (La) and the light B (Lb) are incident onto the first surface 171 of the light extraction pattern 170 which is inclined. Therefore, as compared with the light A' (La') and the light B' (Lb'), the incident angle can be reduced. For example, the incident angles of the light A (La) and the light B (Lb) can be smaller than the incident angles of the light A' (La') and the light B' (Lb') by the first inclination angle $\theta_{171}$ of the first surface 171.

Further, since the light A (La) and the light B (Lb) are incident with a smaller incident angle at the interface between the second inorganic insulating layer 162 and the organic insulating layer 163 on the first surface 171, the refraction angle can also be reduced, and the light can travel to be close to the front direction of the substrate 110, rather than the side direction.

Similarly to the light A (La) and the light B (Lb), the light C (Lc) is also incident onto the inclined interface between the second inorganic insulating layer 162 and the organic insulating layer 163 on the first surface 171 so that the incident angle can be reduced and the refraction angle can also be reduced. The light C (Lc) that is refracted at a relatively smaller refraction angle to travel in the organic insulating layer 163 is incident at the interface between the organic insulating layer 163 and the air layer above the organic insulating layer 163 at an incident angle smaller than the critical angle. Further, the light can be extracted to the outside of the display apparatus 100 without being totally reflected.

Therefore, some of the light directed to the non-emission area NEA, for example, the light A (La) and the light B (Lb) are incident onto the inclined interface between the second inorganic insulating layer 162 and the organic insulating layer 163 in the light extraction pattern 170. Therefore, the incident angle can be smaller than those of the light A' (La') and the light B' (Lb') and the refraction angle can also be reduced. Therefore, some of light directed to the non-emission area NEA, for example, the light A (La) and the light B (Lb) can be refracted to be close to the front direction of the substrate 110. Further, the other light among light directed to the non-emission area NEA, for example, the light C (Lc) is incident onto the inclined interface between the second inorganic insulating layer 162 and the organic insulating layer 163 in the light extraction pattern 170 so that the incident angle can be smaller than that of the light C' (Lc'). Further, the refraction angle can also be reduced, and the light C (Lc)_can be incident above the organic insulating layer 163 at a relatively smaller incident angle so that the light may not be totally reflected.

The effects and advantages by the light extraction pattern 170 of the present disclosure will be described in more detail with reference to FIGS. 5A and 5B.

A length of the first surface 171 can be longer than a length of the second surface 172. For example, a length from an upper side to a lower side of the first surface 171 can be longer than a length from an upper side to a lower side of the second surface 172. For example, among light emitted from the light emitting element 120 of the emission area EA, light directed to the non-emission area NEA can be incident more onto the first surface 171 adjacent to the emission area EA. Therefore, the length of the first surface 171 is formed to be longer to improve a quantity of light incident onto the plurality of light extraction patterns 170 and the light extraction efficiency can also be further improved or enhanced.

The second surface 172 is vertically disposed to form the length of the first surface 171 to the maximum. For example, when the second inclination angle $\theta_{172}$ is set to be 90 degrees to dispose the second surface 172 to be vertical to the upper surface of the second inorganic insulating layer 162, the length of the first surface 171 can be increased to the maximum and the quantity of light incident onto the first surface 171 can also be improved or enhanced. In FIG. 3, even though it is illustrated that the second inclination angle $\theta_{172}$ is an acute angle, the second inclination angle $\theta_{172}$ is disposed at 90 degrees so that only the first surface 171 has a slope, but is not limited thereto.

In FIG. 3, even though it is illustrated that the first surface 171 and the second surface 172 of the light extraction pattern 170 are flat surfaces or plane surfaces, the first surface 171 and the second surface 172 can be convex or concave curved surfaces and a plurality of patterns such as unevenness or concave and convex can be formed on the surfaces of the first surface 171 and the second surface 172. However, the shapes of the first surface 171 and the second surface 172 are not limited thereto. For example, the first surface 171 and the second surface 172 can be one of a flat or plane surface or a curved surface, but are not limited thereto.

Figure 4:
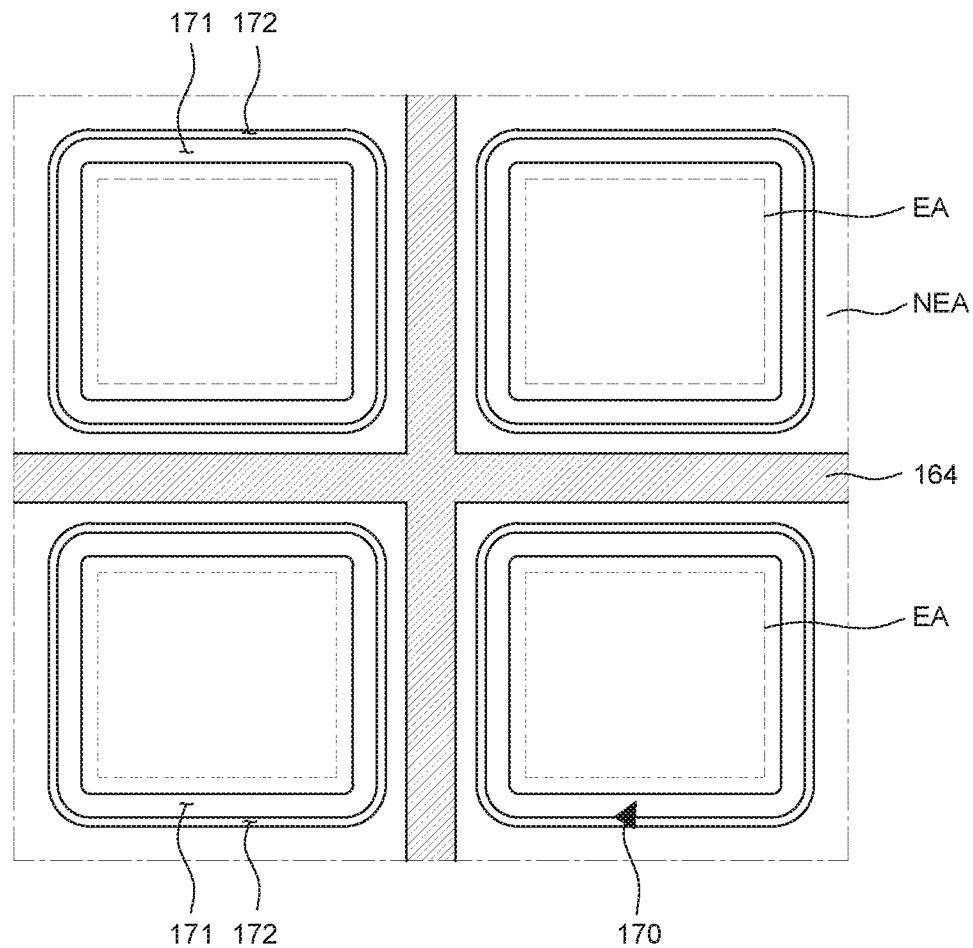
FIG. 4 is an enlarged plan view of a display apparatus according to an exemplary embodiment of the present disclosure.

Next, with reference to FIG. 4, the touch line 164 is disposed along a mesh shaped non-emission area NEA which encloses or surrounds the emission area EA. In the mesh shaped non-emission area NEA, the plurality of light extraction patterns 170 is disposed between the touch line 164 and the emission area EA.

The non-emission area NEA is formed to have a mesh shape that encloses or surrounds the plurality of emission areas EA so that the plurality of light extraction patterns 170 disposed along the non-emission area NEA can be formed to have a closed loop shape that encloses or surrounds the plurality of emission areas EA. Each of the plurality of light extraction patterns 170 can be disposed to enclose or surround corresponding to one of the plurality of emission areas EA. For example, the plurality of light extraction patterns 170 can be disposed around the plurality of emission areas EA. Therefore, at least some of light directed to the non-emission area NEA among light emitted from the light emitting element 120 is refracted to be close to the front direction of the substrate 110 by the light extraction pattern 170 that encloses or surrounds the emission area EA or the total reflection thereof can be minimized or reduced.

In the display apparatus 100 according to the exemplary embodiment of the present disclosure, the plurality of light extraction patterns 170 is disposed on the second inorganic insulating layer 162 having a high refractive index in the non-emission area NEA to reduce the incident angle of light traveling to the non-emission area NEA. Therefore, the light is refracted to be close to the front direction of the substrate 110 or the light that is totally reflected is reduced so that the light extraction efficiency can be improved. For example, light which travels to the organic insulating layer 163 having a low refractive index from the second inorganic insulating layer 162 having a high refractive index is reflected at a larger refraction angle than the incident angle to have a larger incident angle or be totally reflected. For example, when it is assumed that among light emitted from the light emitting element 120 of the emission area EA, light that travels to the non-emission area NEA at the side surface of the light emitting element 120 is incident onto the parallel interface between the second inorganic insulating layer 162 and the organic insulating layer 163, light directed to the non-emission area NEA can be already incident onto the parallel interface between the second inorganic insulating layer 162 and the organic insulating layer 163 with a larger incident angle. Therefore, light incident with a large incident angle is refracted at a larger refraction angle to be totally reflected from the upper portion of the organic insulating layer 163 or extracted to the outside of the display apparatus 100 toward the side direction of the substrate 110.

Therefore, the viewing angle and the light extraction efficiency can be degraded. For example, the light A' (La'), light B' (Lb'), and light C' (Lc') which travel from the emission area EA to the non-emission area NEA to be inclined can be incident onto the parallel interface with a large incident angle. Since the light A' (La'), the light B' (Lb'), and the light C' (Lc') are refracted on the parallel interface at a refraction angle larger than the incident angle, the light can be incident onto the interface between the organic insulating layer 163 and the air layer on the organic insulating layer 163 with a larger incident angle. Thus, even though the light A' (La') and the light B' (Lb') are extracted to the outside of the display apparatus 100, the light A' (La') and the light B' (Lb') travel toward the side direction of the display apparatus 100 due to a larger incident angle so that there can be a viewing angle problem. The light C' (Lc') which is refracted at a larger refraction angle on the parallel interface is incident onto the interface between the organic insulating layer 163 and the air layer above the organic insulating layer 163 at an incident angle larger than the critical angle to be totally reflected. For example, even though light which travels to the non-emission area NEA is extracted to the outside of the display apparatus 100, the light can travel to the side direction or be totally reflected.

Accordingly, in the display apparatus 100 according to the exemplary embodiment of the present disclosure, the light extraction pattern 170 that encloses or surrounds the emission area EA is disposed in the non-emission area NEA to lower the incident angle of light which travels to the non-emission area NEA. Therefore, the light that is totally reflected can be reduced and the light that is extracted to the front direction of the substrate 110 can be increased. The light extraction pattern 170 is disposed on the second inorganic insulating layer 162 so that the interface between the second inorganic insulating layer 162 having a high refractive index and the organic insulating layer 163 having a low refractive index can be disposed to be inclined. If the light which travels to be inclined from the emission area EA to the non-emission area NEA is incident onto the inclined interface between the second inorganic insulating layer 162 and the organic insulating layer 163, the incident angle of the light is reduced so that the refraction angle can also be reduced. For example, since the light traveling to be inclined is incident onto the first surface 171 that is disposed to be inclined, the incident angle of the light can be reduced by the first inclination angle $\theta_{171}$ of the first surface 171. Therefore, the light extraction pattern 170 is disposed to reduce the incident angle of light which is incident onto the inclined interface between the second inorganic insulating layer 162 and the organic insulating layer 163 as much as possible. As the incident angle is reduced, the refraction angle is also reduced so that light which is extracted to the front direction of the substrate 110 is increased. For example, since the first surface 171 has a slope, the light A (La), the light B (Lb), and the light C (Lc) which travel from the emission area EA to the non-emission area NEA to be inclined can be incident onto the first surface 171 with a smaller incident angle. Since the light A (La), the light B (Lb), and the light C (Lc) are incident onto the light extraction pattern 170 with a smaller incident angle, the refraction angle can also be reduced and the light can be incident onto the interface between the organic insulating layer 163 and the air layer on the organic insulating layer 163 with a small incident angle. Therefore, when the light A (La) and the light B (Lb) are extracted to the outside of the display apparatus 100, the light A (La) and the light B (Lb) can be extracted to be close to the front direction of the display apparatus 100. Further, the light C (Lc) is not totally reflected but can be extracted to the outside of the display apparatus 100. Therefore, in the display apparatus 100 according to the exemplary embodiment of the present disclosure, the plurality of light extraction patterns 170 is disposed in the non-emission area NEA, so that the light extraction efficiency and the viewing angle of the light emitting element 120 can be improved. Further, the plurality of light extraction patterns 170 is disposed in the non-emission area NEA so that the light extraction efficiency and the viewing angle of the display apparatus 100 can be improved without affecting on the emission area EA.

In the display apparatus 100 according to the exemplary embodiment of the present disclosure, the light extraction pattern 170 is disposed in the touch part 160 on the encapsulation part 150 so that the sealing property of the encapsulation part 150 can be maintained. The encapsulation part 150 is a sealing member which protects the light emitting element 120 from the moisture, oxygen, impact from the outside and can have a structure in which the first inorganic encapsulation layer 151 and the second inorganic encapsulation layer 153 formed of an inorganic material and the organic encapsulation layer 152 formed of an organic material are alternately laminated. Specifically, the organic encapsulation layer 152 formed of an organic material is relatively vulnerable to the moisture and oxygen, so that the first inorganic encapsulation layer 151 and the second inorganic encapsulation layer 153 formed of an inorganic material can be disposed to enclose the entire organic encapsulation layer 152. When the light extraction pattern 170 is formed by forming a groove to expose the organic encapsulation layer 152 of the encapsulation part 150, the sealing property of the encapsulation part 150 can be degraded. Further, it can be difficult to protect the light emitting element 120 from the outside. In the display apparatus 100 according to the exemplary embodiment of the present disclosure, the light extraction pattern 170 is disposed in the touch part 160 so that the light extraction efficiency can be improved without degrading the sealing property of the encapsulation part 150. Further, the light extraction pattern 170 can be implemented by forming a pattern on the mask during the process of forming the touch part 160 so that the light extraction pattern 170 can be formed without an additional process.

Hereinafter, the effects and advantages according to the plurality of light extraction patterns 170 of the display apparatus 100 in accordance with the exemplary embodiment of the present disclosure will be described in more detail with reference to FIGS. 5A and 5B.

Figure 5A:
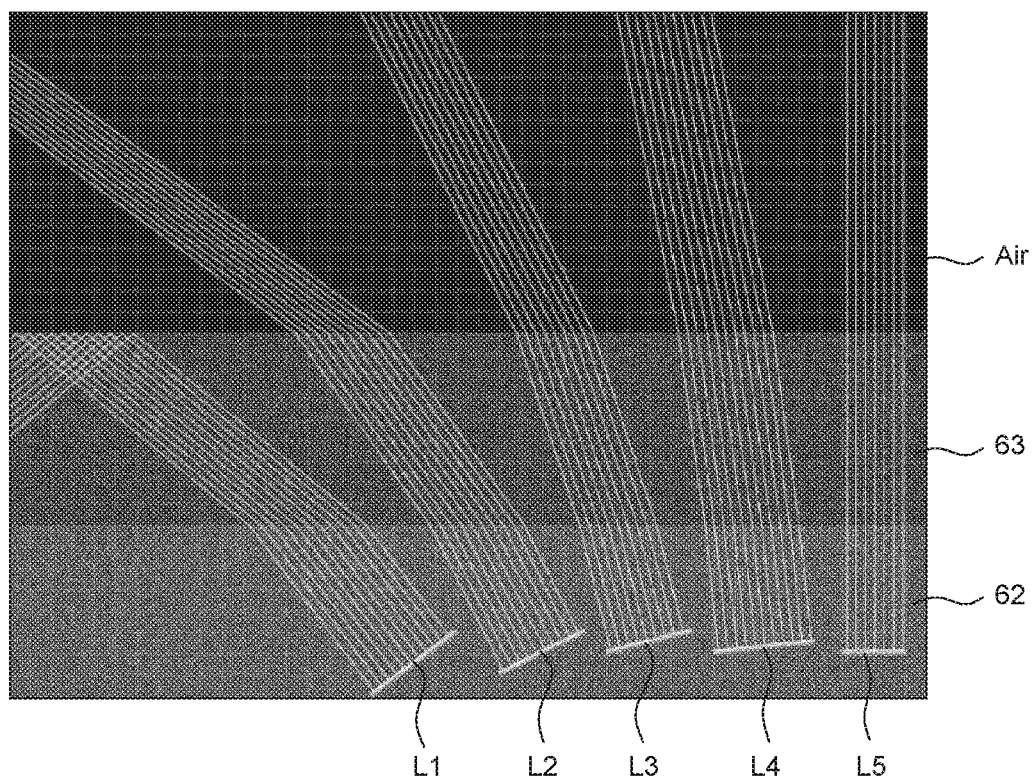
FIG. 5A illustrates a simulation of a traveling path of light in a display apparatus according to a comparative example.

FIG. 5A illustrates a simulation of a traveling path of light in a display apparatus according to a comparative example. FIG. 5B illustrates a simulation of a traveling path of light in a display apparatus according to an exemplary embodiment of the present disclosure. As compared with the display apparatus 100 according to the exemplary embodiment of the present disclosure, a display apparatus 10 according to a comparative example of FIG. 5A can have the substantially same components except that the light extraction pattern 170 is not disposed on a second inorganic insulating layer 62. Therefore, a redundant description will be omitted or may be brief.

Figure 5B:
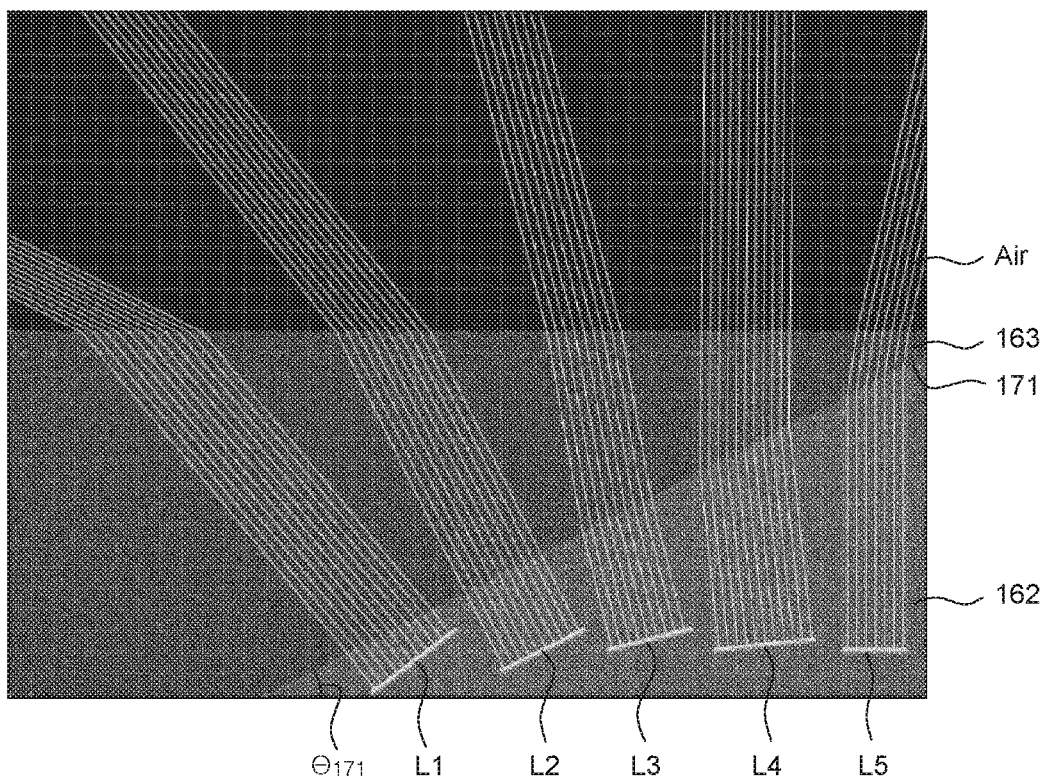
FIG. 5B illustrates a simulation of a traveling path of light in a display apparatus according to an exemplary embodiment of the present disclosure.

In FIGS. 5A and 5B, according to a Ray optics simulation program, refractive indexes of the second inorganic insulating layers 62 and 162 are set to be 1.8, refractive indexes of the organic insulating layers 63 and 163 are set to be 1.4 and a refractive index of the air layer Air is set to be 1. Initial traveling angles of the first light L1 to fifth light L5 with respect to the upper surface of the substrate 110 which are incident angles of first light L1 to fifth light L5 with respect to a parallel interface are set to be 37 degrees, 27 degrees, 14 degrees, 11 degrees, and 0 degree. Under this condition, the experiment results of the light traveling path of the comparative example and the exemplary embodiment are illustrated. Even though other components such as a polarizing plate or other films can be disposed on the organic insulating layers 63 and 163, all the refractive indexes of the polarizing plate or films are larger than the refractive index of air layer Air. Therefore, the light can be refracted due to the total reflection during the process of emitting the light to the air layer Air. Therefore, during the experiment, the experiment was carried out under the assumption that the air layer Air was disposed immediately on the organic insulating layer 163.

With reference to FIG. 5A, in the display apparatus 10 according to the comparative example, the plurality of light extraction patterns 170 is not disposed on the second inorganic insulating layer 62 so that the interface between the second inorganic insulating layer 62 and the organic insulating layer 63 is disposed to be parallel.

The first light L1 to the fifth light L5 are refracted while passing through the interface between the second inorganic insulating layer 62 and the organic insulating layer 63. For example, the first light L1 is incident on the interface between the second inorganic insulating layer 62 and the organic insulating layer 63 at an incident angle of 37 degrees. Further, the first light L1 can be refracted at the interface between the second inorganic insulating layer 62 having a high refractive index and the organic insulating layer 63 having a low refractive index with a refraction angle larger than 37 degrees.

Next, when the second light L2 with an incident angle of 27 degrees, the third light L3 with an incident angle of 14 degrees, and the fourth light L4 with an incident angle of 11 degrees travel from the second inorganic insulating layer 62 having a high refractive index to the organic insulating layer 63 having a low refractive index, the second light L2, the third light L3, and the fourth light L4 are refracted at the interface between the second inorganic insulating layer 62 and the organic insulating layer 63 with a refraction angle larger than the incident angle.

When the fifth light L5 with an incident angle of 0 degree is directed from the second inorganic insulating layer 62 having a high refractive index to the organic insulating layer 63 having a low refractive index, the fifth light L5 can travel straight without being refracted.

The larger the incident angle, the larger the refraction angle. Therefore, the first light L1 having the largest incident angle can be refracted most and the fourth light L4 having a smaller incident angle can be refracted least. Further, the fifth light L5 having an incident angle of 0 degree can travel straight without being refracted.

Next, the first light L1 that is refracted at the interface between the second inorganic insulating layer 62 and the organic insulating layer 63 with a refraction angle larger than 37 degrees can be incident onto the interface between the organic insulating layer 63 and the air layer Air. However, the first light L1 that is already refracted at the interface between the second inorganic insulating layer 62 and the organic insulating layer 63 is incident onto the interface between the organic insulating layer 63 and the air layer Air with an incident angle larger than the critical angle to be totally reflected. Therefore, the first light L1 is not extracted to the outside of the display apparatus 10.

Next, the second light L2 to fourth light L4 are refracted at the interface between the second inorganic insulating layer 62 and the organic insulating layer 63 with a refraction angle larger than the initial incident angle and then incident onto the interface between the organic insulating layer 63 and the air layer Air. Further, since the second light L2 to fourth light L4 are refracted at the interface between the organic insulating layer 63 and the air layer Air at a refraction angle larger than the incident angle again to be extracted, the light that is extracted to the front direction of the substrate 110 can be reduced.

Next, since the initial incident angle of the fifth light L5 is 0 degree, the fifth light continuously travels straight to be extracted to the front direction of the substrate 110.

When the light emitted from the light emitting element 120 is extracted to the front direction of the substrate 110, like the fifth light L5, the efficiency and the viewing angle of the light emitting element 120 can be improved. However, in the display apparatus 10 according to the comparative example, among light emitted from the light emitting element 120, light having an initial incident angle with respect to the interface between the second inorganic insulating layer 62 and the organic insulating layer 63 that is larger than 0 degree is continuously refracted on the interface between the second inorganic insulating layer 62 and the organic insulating layer 63 and the interface between the organic insulating layer 63 and the air layer Air with a refraction angle larger than the incident angle or totally reflected. Therefore, the light extracted to the front direction of the substrate 110 can be reduced and the efficiency of the light emitting element 120 and the viewing angle can be degraded.

With reference to FIG. 5B, in the display apparatus 100 according to the exemplary embodiment of the present disclosure, the plurality of light extraction patterns 170 is disposed on the second inorganic insulating layer 162 and the interface between the second inorganic insulating layer 162 and the organic insulating layer 163 can be disposed to be inclined. In FIG. 5B, for the convenience of description, only the first surface 171 of the light extraction pattern 170 is illustrated. A first inclination angle $\theta_{171}$ of the interface between the second inorganic insulating layer 162 and the organic insulating layer 163 on the first surface 171 is 27 degrees.

The first light L1 to the fifth light L5 are refracted while passing through the interface between the second inorganic insulating layer 162 and the organic insulating layer 163. For example, when the first light L1 having an initial traveling angle of 37 degrees is incident onto the first surface 171 having a first inclination angle $\theta_{171}$ of 27 degrees, the incident angle of the first light L1 with respect to the first surface 171 can be 37−27=10 degrees. Therefore, when the first light L1 travels from the second inorganic insulating layer 162 having a high refractive index to the organic insulating layer 163 having a low refractive index, even though the light is refracted at the interface between the second inorganic insulating layer 162 and the organic insulating layer 163, the refraction angle can also be reduced as compared with the first light L1 of the comparative example. For example, the incident angle of the first light L1 according to the exemplary embodiment of the present disclosure is smaller than the incident angle of the first light L1 of the comparative example so that the refraction angle of the first light L1 having a smaller incident angle of the exemplary embodiment can be relatively small. Therefore, according to the exemplary embodiment of the present disclosure, the first surface 171 of the light extraction pattern 170 is disposed to be inclined so that the incident angle of the light can be reduced, and the refraction angle of the light can also be minimized.

According to the exemplary embodiment of the present disclosure, in the case of the light having an initial traveling angle which is larger than the first inclination angle $\theta_{171}$, a substantial incident angle and refraction angle of the light are reduced so that the light which is totally reflected or is not extracted to the front direction of the substrate 110 can be minimized.

Next, when the second light L2 having an initial traveling angle of 27 degrees is incident onto the first surface 171 having a first inclination angle $\theta_{171}$ of 27 degrees, the incident angle of the second light L2 with respect to the first surface 171 can be 0 degree. Therefore, the second light L2 having an incident angle of 0 degree can travel straight without being refracted on the interface between the second inorganic insulating layer 162 and the organic insulating layer 163. Accordingly, in the display apparatus 100 according to the exemplary embodiment of the present disclosure, the light having the initial traveling angle that is the same as the first inclination angle $\theta_{171}$ can travel straight without being refracted.

When third light L3 having an initial traveling angle of 14 degrees, fourth light L4 having an initial traveling angle of 11 degrees, and fifth light L5 having an initial traveling angle of 0 degree are incident onto the first surface 171 having a first inclination angle $\theta_{171}$, the incident angles of the third light L3, the fourth light L4, and the fifth light L5 with respect to the first surface 171 can be 13 degrees, 16 degrees, and 27 degrees. The third light L3, the fourth light L4, and the fifth light L5 are refracted on the interface between the second inorganic insulating layer 162 and the organic insulating layer 163 on the first surface 171 with a refraction angle larger than the incident angle to be close to the emission area EA and the front direction of the substrate 110. Therefore, in the display apparatus 100 according to the exemplary embodiment of the present disclosure, light having an initial traveling angle which is smaller than the first inclination angle $\theta_{171}$ is refracted to the emission area EA or refracted to be close to the front direction of the substrate 110, so that the light extraction efficiency can be improved.

Therefore, when light having an initial traveling angle with respect to the upper surface of the substrate 110 which is larger than the first inclination angle $\theta_{171}$ of the first surface 171, for example, the first light L1 is incident onto the light extraction pattern 170, even though the initial traveling angle of the light is large, the substantial incident angle of the light is small. Therefore, the refraction angle of the light can also be reduced. Accordingly, in the exemplary embodiment of the present disclosure, when light which has a smaller initial traveling angle, that is, light traveling to be inclined, among light directed to the non-emission area NEA, is incident onto the light extraction pattern 170, the degree of refracting the light can be minimized as compared with the comparative example. Further, the light which is not extracted to the front direction of the substrate 110 and the light totally reflected can also be reduced.

Next, light having the same initial traveling angle as the first inclination angle $\theta_{171}$ of the first surface 171 with respect to the upper surface of the substrate 110, for example, the second light L2 is incident onto the light extraction pattern 170, the incident angle with respect to the interface between the second inorganic insulating layer 162 and the organic insulating layer 163 in the light extraction pattern 170 can be 0 degree. Therefore, the light can continuously travel straight without being refracted. Therefore, according to the exemplary embodiment of the present disclosure, the light is refracted at the interface between the organic insulating layer 163 and the air layer Air at a refraction angle that is less than that of the comparative example. Therefore, according to the exemplary embodiment of the present disclosure, the light that is extracted to the front direction of the substrate 110 can be increased and the light that is totally reflected can be reduced.

Finally, when light having an initial traveling angle smaller than the first inclination angle $\theta_{171}$ of the first surface 171 with respect to the upper surface of the substrate 110, for example, the third light L3 to fifth light L5 are incident onto the light extraction pattern 170, the light can be refracted on the light extraction pattern 170. However, the light can be refracted to the emission area EA or the front direction of the substrate 110. Accordingly, according to the exemplary embodiment of the present disclosure, among light directed to the non-emission area NEA, some light can be refracted toward the emission area EA and the front direction of the substrate 110 again, so that the light extraction efficiency and the viewing angle can be improved or enhanced.

Therefore, in the display apparatus 10 according to the comparative example, among light emitted from the light emitting element 120, light that travels to the non-emission area NEA is refracted between the second inorganic insulating layer 62 and the organic insulating layer 63 at a larger refraction angle. Therefore, it is difficult to extract the light to the front direction of the substrate 110 and the light that is totally reflected is also increased so that the light extraction efficiency is degraded, and the viewing angle is also degraded.

In contrast, in the display apparatus 100 according to the exemplary embodiment of the present disclosure, even though among light emitted from the light emitting element 120, some light travels to the non-emission area NEA, the light that is incident onto the interface of the second inorganic insulating layer 162 and the organic insulating layer 163 by the plurality of light extraction patterns 170 can be refracted to the emission area EA and the front direction of the substrate 110 again. Further, the refracting degree can be minimized and the light that is totally reflected can also be reduced. Accordingly, the display apparatus 100 according to the exemplary embodiment of the present disclosure disposes the light extraction pattern 170 in the non-emission area NEA to minimize the total reflection of light directed to the non-emission area NEA among light emitted from the light emitting element 120. Further, the light can be extracted to the front direction of the substrate 110 so that the efficiency and the viewing angle of the light emitting element 120 can be improved or enhanced.

Figure 6:
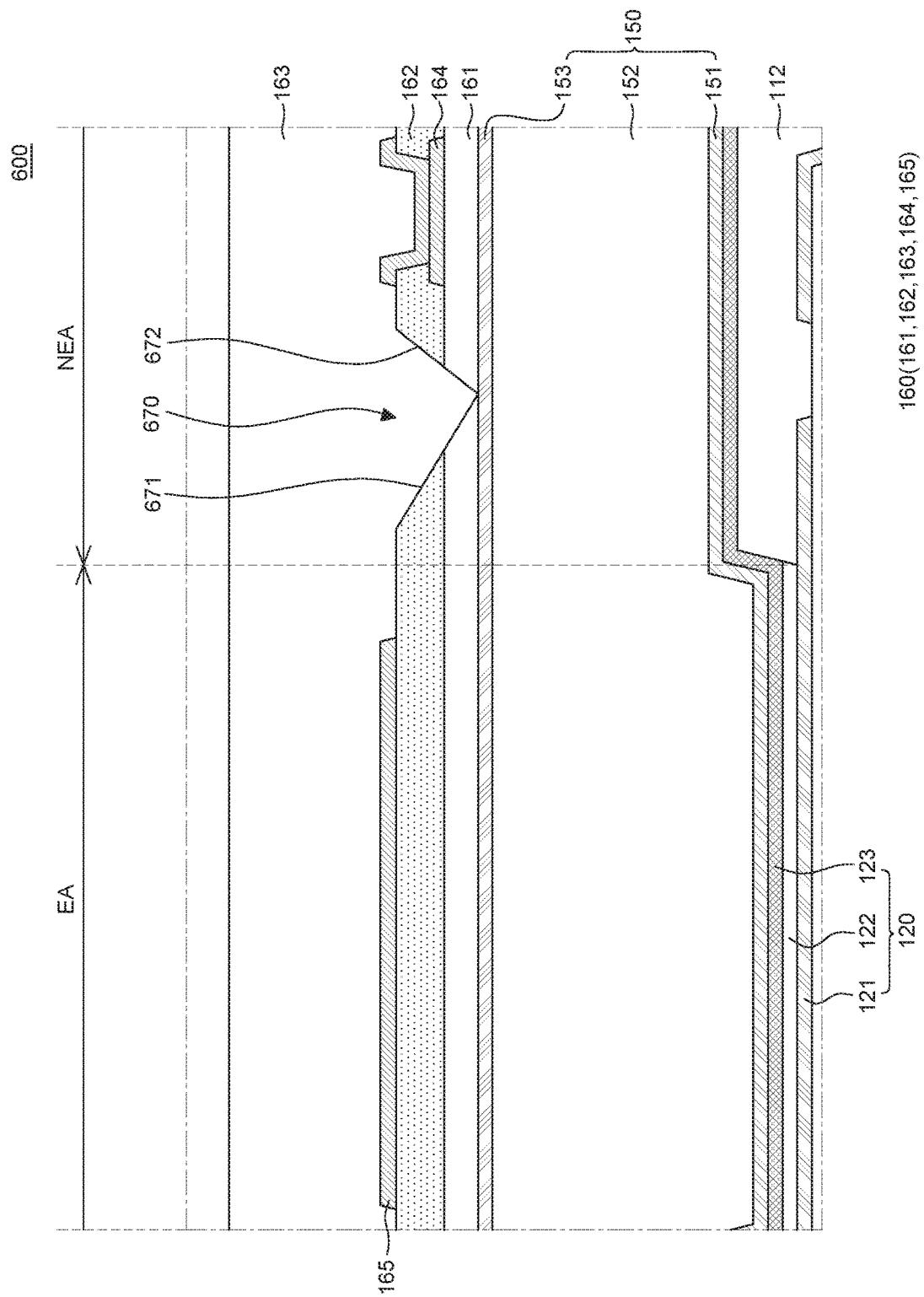
FIG. 6 is a cross-sectional view of a display apparatus according to another exemplary embodiment of the present disclosure.

FIG. 6 is a cross-sectional view of a display apparatus according to another exemplary embodiment of the present disclosure. A plurality of light extraction patterns 670 of a display apparatus 600 illustrated in FIG. 6 is different from those of the display apparatus 100 illustrated in FIGS. 1 to 4, but other components are substantially the same so that a redundant description will be omitted or may be brief.

With reference to FIG. 6, the light extraction pattern 670 is disposed on a second inorganic insulating layer 162 and a first inorganic insulating layer 161 in a non-emission area NEA. The light extraction pattern 670 can be a groove formed in the second inorganic insulating layer 162 and the first inorganic insulating layer 161 in a non-emission area NEA.

The light extraction pattern 670 includes a first surface 671 and a second surface 672. The first surface 671 is disposed to be adjacent to the emission area EA in the non-emission area NEA and the second surface 672 is disposed between the first surface 671 and the touch line 164 in the non-emission area NEA. A width between the first surface 671 and the second surface 672 can be narrower as it is closer to the encapsulation part 150. For example, the light extraction pattern 670 can be a V-shaped groove. As another example, the light extraction pattern 670 can be a triangular, convex, concave, convex lens, or concave lens.

The first surface 671 and the second surface 672 of the light extraction pattern 670 are configured as a side surface of the second inorganic insulating layer 162 and a side surface of the first inorganic insulating layer 161, respectively. For example, the light extraction pattern 670 is disposed to extend from the second inorganic insulating layer 162 to the first inorganic insulating layer 161. The organic insulating layer 163 is disposed inside or inner portion of the plurality of light extraction patterns 670 that is grooves formed in the first inorganic insulating layer 161 and the second inorganic insulating layer 162. The organic insulating layer 163 in an inner portion of the light extraction pattern 670 can be in contact with the side surface of the second inorganic insulating layer 162 and the side surface of the first inorganic insulating layer 161.

An upper side of the first surface 671 is disposed to be adjacent to the emission area EA on the upper surface of the second inorganic insulating layer 162 and a lower side of the first surface 671 is disposed to be adjacent to the touch line 164 on the lower surface of the first inorganic insulating layer 161. An upper side of the second surface 672 is disposed to be adjacent to the touch line 164 on the upper surface of the second inorganic insulating layer 162 and a lower side of the second surface 672 is disposed to be adjacent to the emission area EA on the lower surface of the first inorganic insulating layer 161. Therefore, the first surface 671 and the second surface 672 can be disposed to be inclined with respect to the upper surface of the second inorganic encapsulation layer 153.

When the light emitted from the light emitting element 120 travels to the organic insulating layer 163 having a low refractive index from the first inorganic insulating layer 161 and the second inorganic insulating layer 162 having a high refractive index, the light is refracted to have a refraction angle larger than the incident angle and can be directed to the organic insulating layer 163. At least some of light traveling to the non-emission area NEA can be incident and refracted onto an interface between the first inorganic insulating layer 161 and the organic insulating layer 163 and an interface between the second inorganic insulating layer 162 and the organic insulating layer 163 in the light extraction pattern 670.

The first surface 671 and the second surface 672 have slopes, respectively, so that an incident angle of light that is incident onto the first surface 671 and the second surface 672 of the plurality of light extraction patterns 670 can be reduced. Further, even though the light is refracted, the light can be refracted to be close to the front direction of the substrate 110 or the refraction angle is reduced so that the total reflection when the light passes through other components on the plurality of light extraction patterns 670 can be minimized.

In the display apparatus 600 according to another exemplary embodiment of the present disclosure, the light extraction pattern 670 is disposed on the second inorganic insulating layer 162 and the first inorganic insulating layer 161 in the non-emission area NEA to lower the incident angle of light traveling to the non-emission area NEA. Therefore, the light that is totally reflected can be minimized and the light can be refracted to the front direction of the substrate 110. Since the light extraction pattern 670 is disposed to extend from the second inorganic insulating layer 162 to the first inorganic insulating layer 161, areas of the first surface 671 and the second surface 672 of the light extraction pattern 670 can be increased. Further, light incident onto the light extraction pattern 670 can be increased.

Accordingly, in the display apparatus 600 according to another exemplary embodiment of the present disclosure, the light extraction pattern 670 is disposed on the second inorganic insulating layer 162 and the first inorganic insulating layer 161 to refract light traveling to the non-emission area NEA to be close to the emission area EA or the front direction of the substrate 110. Therefore, the light that is extracted to the front direction of the substrate 110 can be increased. Further, even though light traveling to the non-emission area NEA is refracted from the light extraction pattern 670, the interface of the second inorganic insulating layer 162 and the organic insulating layer 163 and the interface of the first inorganic insulating layer 161 and the organic insulating layer 163 in the light extraction pattern 670 have slopes. Therefore, a substantial incident angle of the light can be reduced, which is different from the traveling angle of the light. Therefore, the refraction angle of the light is also reduced so that the light traveling to the side direction of the substrate 110 is minimized and the total reflection of the light can also be minimized.

Accordingly, in the display apparatus 600 according to another exemplary embodiment of the present disclosure, the area of the light extraction pattern 670 is improved so that light that travels to the non-emission area NEA to be trapped in the display apparatus 600 or is hardly extracted to the front direction is extracted to the front direction of the substrate 110 as much as possible. Therefore, the luminance of the display apparatus 600 can be improved or enhanced.

In the display apparatus 600 according to another exemplary embodiment of the present disclosure, the light extraction pattern 670 is disposed in the touch part 160 so that the degradation of the sealing property of the encapsulation part 150 can be minimized. The light extraction pattern 670 is disposed only in the first inorganic insulating layer 161 and the second inorganic insulating layer 162 on the encapsulation part 150 so that the sealing property of the encapsulation part 150 may not be degraded. For example, if the light extraction pattern 670 is also formed in the organic encapsulation layer 152 of the encapsulation part 150, the moisture and oxygen can reach the light emitting element 120 along the organic encapsulation layer 152 which is vulnerable to the moisture and oxygen and the lifespan and the characteristic of the light emitting element 120 can be degraded. However, in the display apparatus 600 according to another exemplary embodiment of the present disclosure, the light extraction pattern 670 is disposed in the first inorganic insulating layer 161 and the second inorganic insulating layer 162 of the touch part 160 which are formed of inorganic material. Therefore, the sealing property of the encapsulation part 150 is maintained while improving the area of the light extraction pattern 670 so that the lifespan and the light extraction efficiency of the display apparatus 600 can be improved or enhanced.

Figure 7:
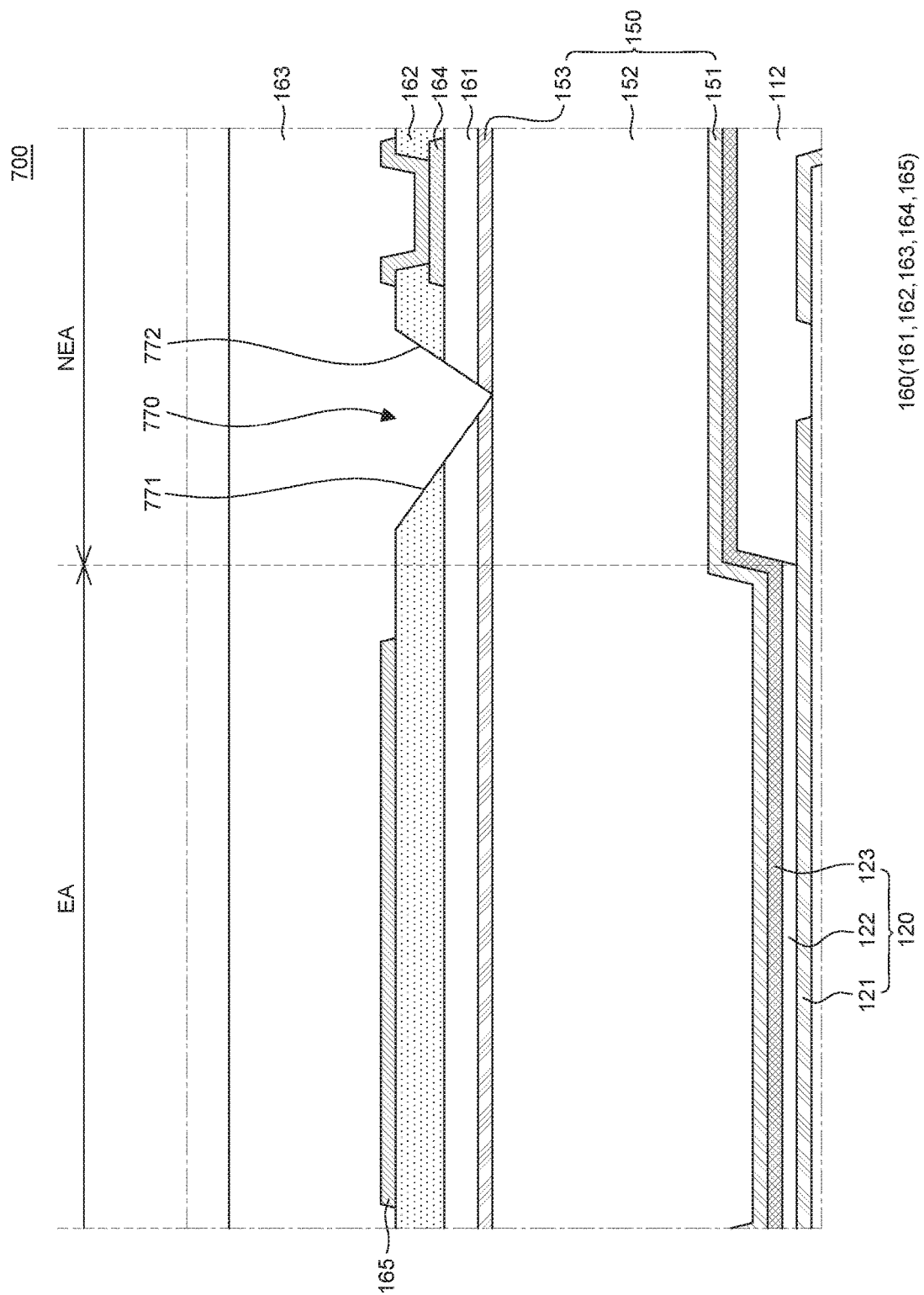
FIG. 7 is a cross-sectional view of a display apparatus according to another exemplary embodiment of the present disclosure.

FIG. 7 is a cross-sectional view of a display apparatus according to another exemplary embodiment of the present disclosure. A plurality of light extraction patterns 770 of a display apparatus 700 illustrated in FIG. 7 is different from those of the display apparatus 100 illustrated in FIGS. 1 to 4, but other components are substantially the same so that a redundant description will be omitted or will be brief.

With reference to FIG. 7, the light extraction pattern 770 is disposed on a second inorganic insulating layer 162, a first inorganic insulating layer 161, and a second inorganic encapsulation layer 153 in a non-emission area NEA. The light extraction pattern 770 can be a groove formed in the second inorganic insulating layer 162, the first inorganic insulating layer 161, and the second inorganic encapsulation layer 153 in the non-emission area NEA.

The light extraction pattern 770 includes a first surface 771 and a second surface 772. The first surface 771 is disposed to be adjacent to the emission area EA in the non-emission area NEA and the second surface 772 is disposed between the first surface 771 and the touch line 164 in the non-emission area NEA. A width between the first surface 771 and the second surface 772 can be narrower as it is closer to the substrate 110. For example, the light extraction pattern 770 can be a V-shaped groove. As another example, the light extraction pattern 770 can be a triangular, convex, concave, convex lens, or concave lens.

The first surface 771 and the second surface 772 of the light extraction pattern 770 are configured as a side surface of the second inorganic insulating layer 162, a side surface of the first inorganic insulating layer 161, and a side surface of the second inorganic encapsulation layer 153, respectively. The organic insulating layer 163 is disposed inside or inner portion of the light extraction patterns 770 that are grooves formed in the first inorganic insulating layer 161, the second inorganic insulating layer 162, and the second inorganic encapsulation layer 153. The organic insulating layer 163 in an inner portion of the light extraction pattern 770 can be in contact with the side surface of the second inorganic insulating layer 162, the side surface of the first inorganic insulating layer 161, and the side surface of the second inorganic encapsulation layer 153.

An upper side of the first surface 771 is disposed to be adjacent to the emission area EA on the upper surface of the second inorganic insulating layer 162 and a lower side of the first surface 771 is disposed to be adjacent to the touch line 164 on the lower surface of the second inorganic encapsulation layer 153. An upper side of the second surface 772 is disposed to be adjacent to the touch line 164 on the upper surface of the second inorganic insulating layer 162 and a lower side of the second surface 772 is disposed to be adjacent to the emission area EA on the lower surface of the second inorganic encapsulation layer 153. Therefore, the first surface 771 and the second surface 772 can be disposed to be inclined with respect to the upper surface of the organic encapsulation layer 152.

When the light emitted from the light emitting element 120 travels to the organic insulating layer 163 having a low refractive index from the second inorganic encapsulation layer 153, the first inorganic insulating layer 161, and the second inorganic insulating layer 162 having a high refractive index, the light can be refracted to have a refraction angle larger than the incident angle and can be directed to the organic insulating layer 163. At least some of light traveling to the non-emission area NEA can be incident and refracted onto an interface between the first inorganic insulating layer 161 and the organic insulating layer 163, an interface between the second inorganic insulating layer 162 and the organic insulating layer 163, and an interface between the second inorganic encapsulation layer 153 and the organic insulating layer 163, in the light extraction pattern 770.

The first surface 771 and the second surface 772 have slopes, respectively, so that an incident angle of light that is incident onto the first surface 771 and the second surface 772 of the plurality of light extraction patterns 770 can be reduced. Further, even though the light is refracted, the light can be refracted to be close to the front direction of the substrate 110 or the refraction angle is reduced so that the total reflection when the light passes through other components on the plurality of light extraction patterns 770 can be minimized.

In the display apparatus 700 according to another exemplary embodiment of the present disclosure, the light extraction patterns 770 are also disposed in the second inorganic insulating layer 162 and the first inorganic insulating layer 161 of the touch part 160 and the second inorganic encapsulation layer 153 of the encapsulation part 150 in the non-emission area NEA. Therefore, the light traveling to the non-emission area NEA can be extracted to the front direction of the substrate 110 and the total reflection can be minimized. Since the light extraction pattern 770 is disposed to extend from the second inorganic insulating layer 162 to the first inorganic insulating layer 161 and the second inorganic encapsulation layer 153, areas of the first surface 771 and the second surface 772 of the light extraction pattern 770 can be increased. Further, light incident onto the light extraction pattern 770 can be increased. Accordingly, in the display apparatus 700 according to another exemplary embodiment of the present disclosure, the light extraction pattern 770 is disposed on the second inorganic insulating layer 162, the first inorganic insulating layer 161, and the second inorganic encapsulation layer 153 to refract light traveling to the non-emission area NEA to be close to the emission area EA or the front direction of the substrate 110. Therefore, the light which is extracted to the front direction of the substrate 110 can be increased. Further, even though light traveling to the non-emission area NEA is refracted from the light extraction pattern 770, the interface of the second inorganic insulating layer 162 and the organic insulating layer 163, the interface of the first inorganic insulating layer 161 and the organic insulating layer 163, and the interface between the second inorganic encapsulation layer 153 and the organic insulating layer 163 in the light extraction pattern 770 have slopes. Therefore, a substantial incident angle of the light can be reduced, which is different from the traveling angle of the light, and the refraction angle of the light can also be reduced so that the light which travels to the side direction of the substrate 110 or is totally reflected can be minimized. Accordingly, in the display apparatus 700 according to another exemplary embodiment of the present disclosure, the area of the light extraction pattern 770 that encloses or surrounds the emission area EA is improved so that light that travels to the non-emission area NEA to be trapped in the display apparatus 700 or hardly extracted to the front direction is extracted to the front direction of the substrate 110 as much as possible. Therefore, the light extraction efficiency can be improved and the viewing angle of the display apparatus 700 can also be improved or enhanced.

A display apparatus according to one or more embodiments of the present disclosure will be described below.

A display apparatus according to an embodiment of the present disclosure includes a substrate including a display area configured by a plurality of emission areas and a non-emission area between the plurality of emission areas, an encapsulation part that covers the display area, a touch part including a plurality of insulating layers disposed on the encapsulation part and a touch line in the non-emission area, and a plurality of light extraction patterns between the touch line and the plurality of emission areas. The plurality of light extraction patterns includes grooves disposed at least a portion of the plurality of insulating layers.

According to some embodiments of the present disclosure, each of the plurality of light extraction patterns can include a first surface disposed to be adjacent to the plurality of emission areas in the non-emission area, and a second surface disposed between the first surface and the touch line in the non-emission area. A width between the first surface and the second surface can decrease as approaching the substrate According to some embodiments of the present disclosure, an upper side of the first surface can be disposed to be adjacent to the plurality of emission areas and a lower side of the first surface can be further adjacent (e.g., can be closer) to the touch line than the upper side of the first surface.

According to some embodiments of the present disclosure, a length from an upper side to a lower side of the first surface can be longer than a length from an upper side to a lower side of the second surface.

According to some embodiments of the present disclosure, an angle between the first surface and an upper surface of the encapsulation part can be smaller than an angle between the second surface and the upper surface of the encapsulation part.

According to some embodiments of the present disclosure, the plurality of light extraction patterns can have a closed loop shape which surrounds each of the plurality of emission areas.

According to some embodiments of the present disclosure, each of the first surface and the second surface can be one of a plane surface or a curved surface.

According to some embodiments of the present disclosure, the plurality of insulating layers can include a first inorganic insulating layer on the encapsulation part, a second inorganic insulating layer disposed on the first inorganic insulating layer, and an organic insulating layer disposed on the second inorganic insulating layer to fill an inner portion of the plurality of light extraction patterns. The plurality of light extraction patterns can be disposed at the second inorganic insulating layer.

According to some embodiments of the present disclosure, the plurality of light extraction patterns can be disposed at the first inorganic insulating layer and the second inorganic insulating layer. The first surface and the second surface can include a side surface of the first inorganic insulating layer and a side surface of the second inorganic insulating layer.

According to some embodiments of the present disclosure, the encapsulation part can include an inorganic encapsulation layer under the first inorganic insulating layer, and an organic encapsulation layer under the inorganic encapsulation layer. The plurality of light extraction patterns can be disposed at the first inorganic insulating layer, the second inorganic insulating layer, and the inorganic encapsulation layer. The first surface and the second surface can include a side surface of the first inorganic insulating layer, a side surface of the second inorganic insulating layer, and a side surface of the inorganic encapsulation layer.

According to some embodiments of the present disclosure, a refractive index of at least one among the inorganic encapsulation layer, the first inorganic insulating layer, and the second inorganic insulating layer can be larger than a refractive index of the organic insulating layer.

A display apparatus according to an embodiment of the present disclosure includes a substrate having a plurality of emission areas and a non-emission area between the plurality of emission areas, an encapsulation part that covers the substrate, a touch part disposed on the encapsulation part, and a plurality of light extraction patterns disposed to surround the plurality of emission areas in the non-emission area. A width of the plurality of light extraction patterns decreases as approaching the substrate, and the plurality of light extraction patterns extracts at least a portion of light which is directed from the plurality of emission areas to the non-emission area to a front direction of the substrate.

According to some embodiments of the present disclosure, the touch part can include a touch line disposed in the non-emission area, a first inorganic insulating layer disposed on the encapsulation part, a second inorganic insulating layer disposed on the first inorganic insulating layer, and an organic insulating layer disposed on the second inorganic insulating layer. The plurality of light extraction patterns can be disposed between the touch line and the plurality of emission areas at the second inorganic insulating layer.

According to some embodiments of the present disclosure, the plurality of light extraction patterns can extend to the first inorganic insulating layer from the second inorganic insulating layer.

According to some embodiments of the present disclosure, the encapsulation part can include an inorganic encapsulation layer which is in contact with the first inorganic insulating layer, and an organic encapsulation layer under the inorganic encapsulation layer. The plurality of light extraction patterns can extend to the first inorganic insulating layer and the inorganic encapsulation layer from the second inorganic insulating layer.

According to some embodiments of the present disclosure, the plurality of light extraction patterns can include a first surface that is disposed to be most adjacent to the plurality of emission areas. An upper side of the first surface can be further adjacent (e.g., can be closer) to the plurality of emission areas than a lower side of the first surface.

According to some embodiments of the present disclosure, refractive indexes of the inorganic encapsulation layer, the first inorganic insulating layer, and the second inorganic insulating layer can be larger than a refractive index of the organic insulating layer. The plurality of light extraction patterns can be configured to lower an incident angle of at least some of light which is directed to the organic insulating layer from the inorganic encapsulation layer, the first inorganic insulating layer, and the second inorganic insulating layer.

A display apparatus according to an embodiment of the present disclosure includes a substrate including a display area having a plurality of emission areas and a non-emission area between the plurality of emission areas, an encapsulation part that covers the substrate, and a plurality of light extraction patterns disposed to surround the plurality of emission areas in the non-emission area. A width of the plurality of light extraction patterns decreases as approaching the substrate, and the plurality of light extraction patterns extracts at least a portion of light which is directed from the plurality of emission areas to the non-emission area to a front direction of the substrate.

According to some embodiments of the present disclosure, the plurality of light extraction patterns can have a closed loop shape that surrounds corresponding one of the plurality of emission areas.

According to some embodiments of the present disclosure, each of the plurality of light extraction patterns can include a first surface that is disposed to be most adjacent to corresponding one of the plurality of emission areas, and an upper side of the first surface is further adjacent (e.g., can be closer) to the corresponding one of the plurality of emission areas than a lower side of the first surface.

It will be apparent to those skilled in the art that various modifications and variations can be made in the present disclosure without departing from the technical idea or scope of the disclosure. Thus, it can be intended that embodiments of the present disclosure cover the modifications and variations of the disclosure provided they come within the scope of the appended claims and their equivalents.

What is claimed is:
1. A display apparatus, comprising:
   a substrate including a display area having a plurality of emission areas and a non-emission area between the plurality of emission areas;
   an encapsulation part that covers the display area;

a touch part including a plurality of insulating layers on the encapsulation part and a touch line in the non-emission area; and a plurality of light extraction patterns between the touch line and the plurality of emission areas, wherein the plurality of light extraction patterns includes grooves at at least a portion of the plurality of insulating layers.

2. The display apparatus of claim 1, wherein each of the plurality of light extraction patterns includes:

a first surface being adjacent to the plurality of emission areas in the non-emission area; and a second surface between the first surface and the touch line in the non-emission area, and wherein a width between the first surface and the second surface decreases as approaching the substrate.

3. The display apparatus of claim 2, wherein for each of at least one of the plurality of light extraction patterns, an upper side of the first surface is adjacent to the plurality of emission areas, and a lower side of the first surface is closer to the touch line than the upper side of the first surface.

4. The display apparatus of claim 2, wherein for each of at least one of the plurality of light extraction patterns, a length from an upper side to a lower side of the first surface is longer than a length from an upper side to a lower side of the second surface.

5. The display apparatus of claim 2, wherein an angle between the first surface and an upper surface of the encapsulation part is smaller than an angle between the second surface and the upper surface of the encapsulation part.

6. The display apparatus of claim 2, wherein the plurality of light extraction patterns has a closed loop shape that surrounds each of the plurality of emission areas.

7. The display apparatus of claim 2, wherein for each of at least one of the plurality of light extraction patterns, each of the first surface and the second surface is one of a plane surface or a curved surface.

8. The display apparatus of claim 2, wherein the plurality of insulating layers includes:

a first inorganic insulating layer on the encapsulation part;

a second inorganic insulating layer on the first inorganic insulating layer; and an organic insulating layer on the second inorganic insulating layer configured to fill an inner portion of the plurality of light extraction patterns, and wherein the plurality of light extraction patterns is disposed at the second inorganic insulating layer.

9. The display apparatus of claim 8, wherein the plurality of light extraction patterns is disposed at the first inorganic insulating layer and the second inorganic insulating layer, and the first surface and the second surface include a side surface of the first inorganic insulating layer and a side surface of the second inorganic insulating layer.

10. The display apparatus of claim 8, wherein the encapsulation part includes:

an inorganic encapsulation layer under the first inorganic insulating layer; and an organic encapsulation layer under the inorganic encapsulation layer, wherein the plurality of light extraction patterns is disposed at the first inorganic insulating layer, the second inorganic insulating layer, and the inorganic encapsulation layer, and wherein the first surface and the second surface include a side surface of the first inorganic insulating layer, a side surface of the second inorganic insulating layer, and a side surface of the inorganic encapsulation layer.

11. The display apparatus of claim 10, wherein a refractive index of at least one among the inorganic encapsulation layer, the first inorganic insulating layer, and the second inorganic insulating layer is larger than a refractive index of the organic insulating layer.

12. A display apparatus, comprising:

a substrate having a plurality of emission areas and a non-emission area between the plurality of emission areas;

an encapsulation part that covers the substrate;

a touch part on the encapsulation part; and a plurality of light extraction patterns disposed to surround the plurality of emission areas in the non-emission area, wherein a width of the plurality of light extraction patterns decreases as approaching the substrate, and wherein the plurality of light extraction patterns extracts at least a portion of light that is directed from the plurality of emission areas to the non-emission area, to a front direction of the substrate.

13. The display apparatus of claim 12, wherein the touch part includes:

a touch line in the non-emission area;

a first inorganic insulating layer on the encapsulation part;

a second inorganic insulating layer on the first inorganic insulating layer; and an organic insulating layer on the second inorganic insulating layer, and wherein the plurality of light extraction patterns is disposed between the touch line and the plurality of emission areas at the second inorganic insulating layer.

14. The display apparatus of claim 13, wherein the plurality of light extraction patterns extends to the first inorganic insulating layer from the second inorganic insulating layer.

15. The display apparatus of claim 13, wherein the encapsulation part includes:

an inorganic encapsulation layer being in contact with the first inorganic insulating layer; and an organic encapsulation layer under the inorganic encapsulation layer, and wherein the plurality of light extraction patterns extends to the first inorganic insulating layer and the inorganic encapsulation layer from the second inorganic insulating layer.

16. The display apparatus of claim 13, wherein the plurality of light extraction patterns includes:

a first surface that is disposed to be most adjacent to the plurality of emission areas, and an upper side of the first surface is closer to the plurality of emission areas than a lower side of the first surface.

17. The display apparatus of claim 13, wherein refractive indexes of the inorganic encapsulation layer, the first inorganic insulating layer, and the second inorganic insulating layer are larger than a refractive index of the organic insulating layer, and wherein the plurality of light extraction patterns is configured to lower an incident angle of at least some of light that is directed to the organic insulating layer from the inorganic encapsulation layer, the first inorganic insulating layer, and the second inorganic insulating layer.

18. A display apparatus, comprising:
- a substrate including a display area having a plurality of emission areas and a non-emission area between the plurality of emission areas;
- an encapsulation part that covers the substrate; and
- a plurality of light extraction patterns, each of the plurality of light extraction patterns disposed to surround a corresponding one of the plurality of emission areas in the non-emission area,
- wherein a width of the plurality of light extraction patterns decreases as approaching the substrate, and
- wherein the plurality of light extraction patterns extracts at least a portion of light that is directed from the plurality of emission areas to the non-emission area to a front direction of the substrate.

19. The display apparatus of claim 18, wherein the plurality of light extraction patterns has a closed loop shape that surrounds corresponding one of the plurality of emission areas.

20. The display apparatus of claim 18, wherein each of the plurality of light extraction patterns includes:
- a first surface that is disposed to be most adjacent to corresponding one of the plurality of emission areas, and
- an upper side of the first surface is closer to the corresponding one of the plurality of emission areas than a lower side of the first surface.

* * * * *